US012669535B2

(12) United States Patent
Hoevenaar et al.

(10) Patent No.: US 12,669,535 B2
(45) Date of Patent: Jun. 30, 2026

(54) METHOD AND SYSTEM FOR DYNAMICALLY CHANGING POWER SUPPLY RAIL SETTING BASED ON INPUT VALUES

(71) Applicant: Snap-on Incorporated, Kenosha, WI (US)

(72) Inventors: Robert Hoevenaar, De Weere (NL); Gary F. Stefanik, Elmhurst, IL (US)

(73) Assignee: Snap-on Incorporated, Kenosha, WI (US)

( * ) Notice: Subject to any disclaimer, the term of this patent is extended or adjusted under 35 U.S.C. 154(b) by 284 days.

(21) Appl. No.: 18/502,730

(22) Filed: Nov. 6, 2023

(65) Prior Publication Data

US 2025/0147098 A1 May 8, 2025

(51) Int. Cl.
| | |
|---|---|
| *G01R 31/28* | (2006.01) |
| *G01R 31/396* | (2019.01) |
| *H03F 3/45* | (2006.01) |
| *H03K 19/173* | (2006.01) |
| *H03M 1/66* | (2006.01) |

(52) U.S. Cl.
CPC ....... *G01R 31/2832* (2013.01); *G01R 31/396* (2019.01); *H03F 3/45* (2013.01); *H03K 19/173* (2013.01); *H03M 1/66* (2013.01)

(58) Field of Classification Search
CPC ..... G01R 31/2832; G01R 31/396; H03F 3/45; H03K 19/173; H03M 1/66
USPC .......................... 324/500, 600, 76.11, 750.01
See application file for complete search history.

(56) References Cited

U.S. PATENT DOCUMENTS

| | | | |
|---|---|---|---|
| 8,427,851 | B2 | 4/2013 | Lesso |
| 10,374,444 | B2 | 8/2019 | Worry et al. |
| 10,855,187 | B1 * | 12/2020 | Chen ................. H02M 3/33507 |
| 2012/0306477 | A1 * | 12/2012 | Daigle ................. H03K 5/2481 |
| | | | 324/123 R |

(Continued)

OTHER PUBLICATIONS

RECOM Power GmbH & RECOM Engineering Gmbh & Co KG; "An Introduction to Buck, Boost, and Buck/Boost Converters;" 3 pages; Oct. 30, 2020.

(Continued)

*Primary Examiner* — Huy Q Phan
*Assistant Examiner* — Trung Q Nguyen
(74) *Attorney, Agent, or Firm* — McDonnell Boehnen Hulbert & Berghoff LLP

(57) ABSTRACT

A method and system for controlling a power supply rail. The method includes adjusting a power supply rail for circuit component(s) to a first setting. The method includes determining voltage sample(s) by sampling an input voltage corresponding to an input signal. The method also includes determining whether the voltage sample(s) breach a first or second voltage threshold. Additionally, the method includes adjusting the power supply rail to a second setting if a predetermined quantity of the voltage sample(s) breach the first voltage threshold, wherein a magnitude of the second setting equals or is greater than a magnitude of the first setting; and adjusting the power supply rail to a third setting if the voltage sample(s) are captured during at least a threshold amount of time and do not breach the second voltage threshold. The magnitude of the first setting is greater than a magnitude of the third setting.

30 Claims, 12 Drawing Sheets

(56) References Cited

U.S. PATENT DOCUMENTS

| | | | | |
|---|---|---|---|---|
| 2013/0027123 A1* | 1/2013 | Idgunji | .............. | H03K 19/0016 |
| | | | | 327/543 |
| 2014/0092507 A1* | 4/2014 | Lefferts | ................. | H02H 9/046 |
| | | | | 361/56 |
| 2014/0266468 A1* | 9/2014 | Jones | .................... | H03F 1/0238 |
| | | | | 330/297 |
| 2021/0165050 A1* | 6/2021 | Gupta | ................... | G06F 1/3296 |
| 2023/0208374 A1* | 6/2023 | Cascio | ................. | H03F 1/0222 |
| | | | | 330/252 |
| 2024/0038321 A1* | 2/2024 | Sasmal | .............. | G01R 31/2839 |
| 2025/0004523 A1* | 1/2025 | Joos | ..................... | G06F 1/3237 |

OTHER PUBLICATIONS

Maxim Integrated Products, Inc.; Application note 2031; DC-DC Converter Tutorial; 14 pages; Nov. 29, 2001.
Texas Instruments Incorporated; "TPS55288 36-V, 16-A Buck-boost Converter with 12C Interface"; 54 pages; SLVSF01B—Nov. 2018—Revised Dec. 2020.
International Searching Authority; Notification of Transmittal of the International Search Report and the Written Opinion of the International Searching Authority, or the Declaration, and the International Search Report and Written Opinion, all for corresponding International Application No. PCT/US2024/052187, mailing date Jan. 30, 2025, 15 pages.

* cited by examiner

Figure 6:
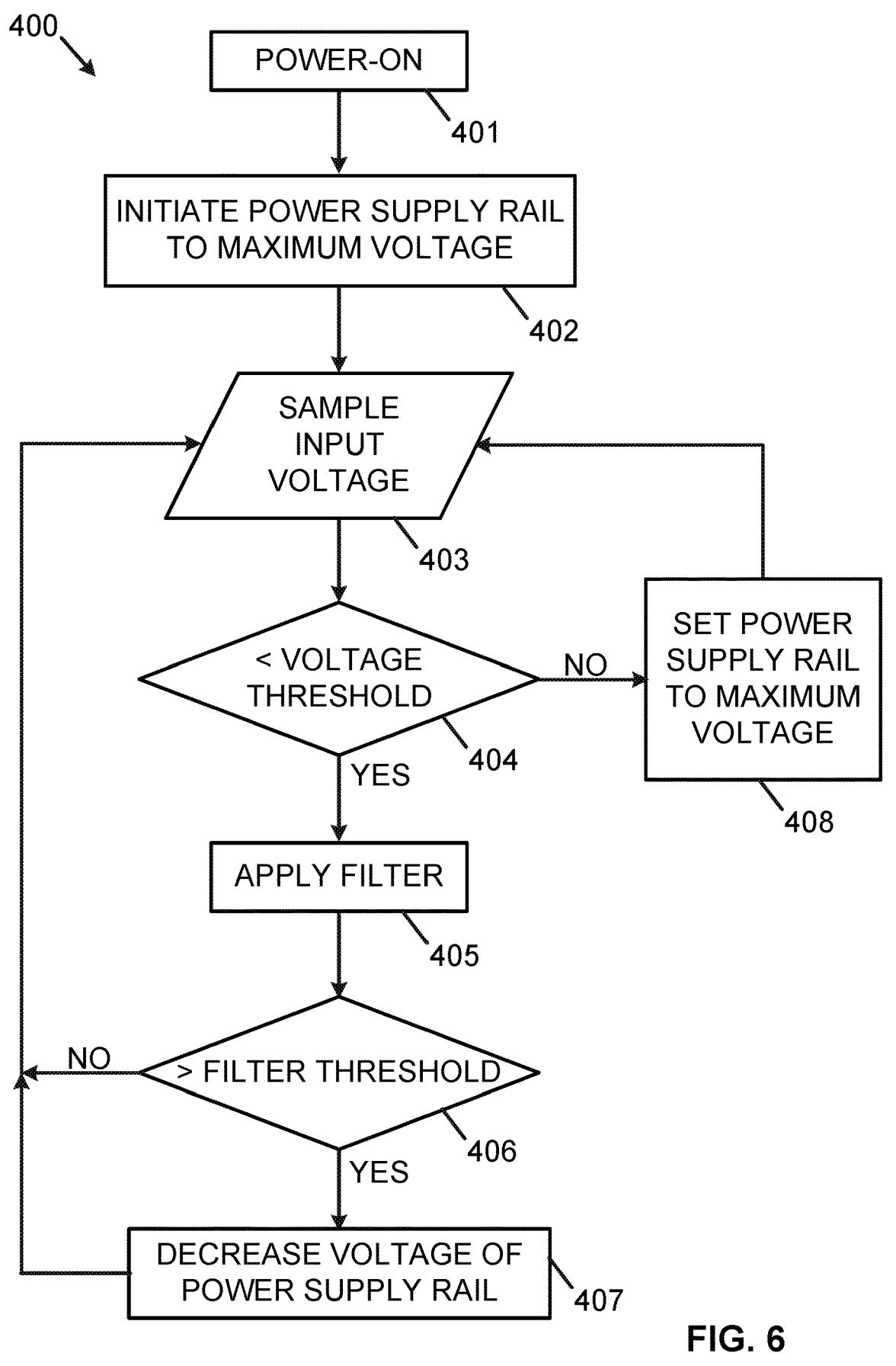

400

POWER-ON

401

INITIATE POWER SUPPLY RAIL
TO MAXIMUM VOLTAGE

402

SAMPLE
INPUT
VOLTAGE

403

< VOLTAGE
THRESHOLD

NO

SET POWER
SUPPLY RAIL
TO MAXIMUM
VOLTAGE

408

404

YES

APPLY FILTER

405

> FILTER THRESHOLD

NO

406

YES

DECREASE VOLTAGE OF
POWER SUPPLY RAIL

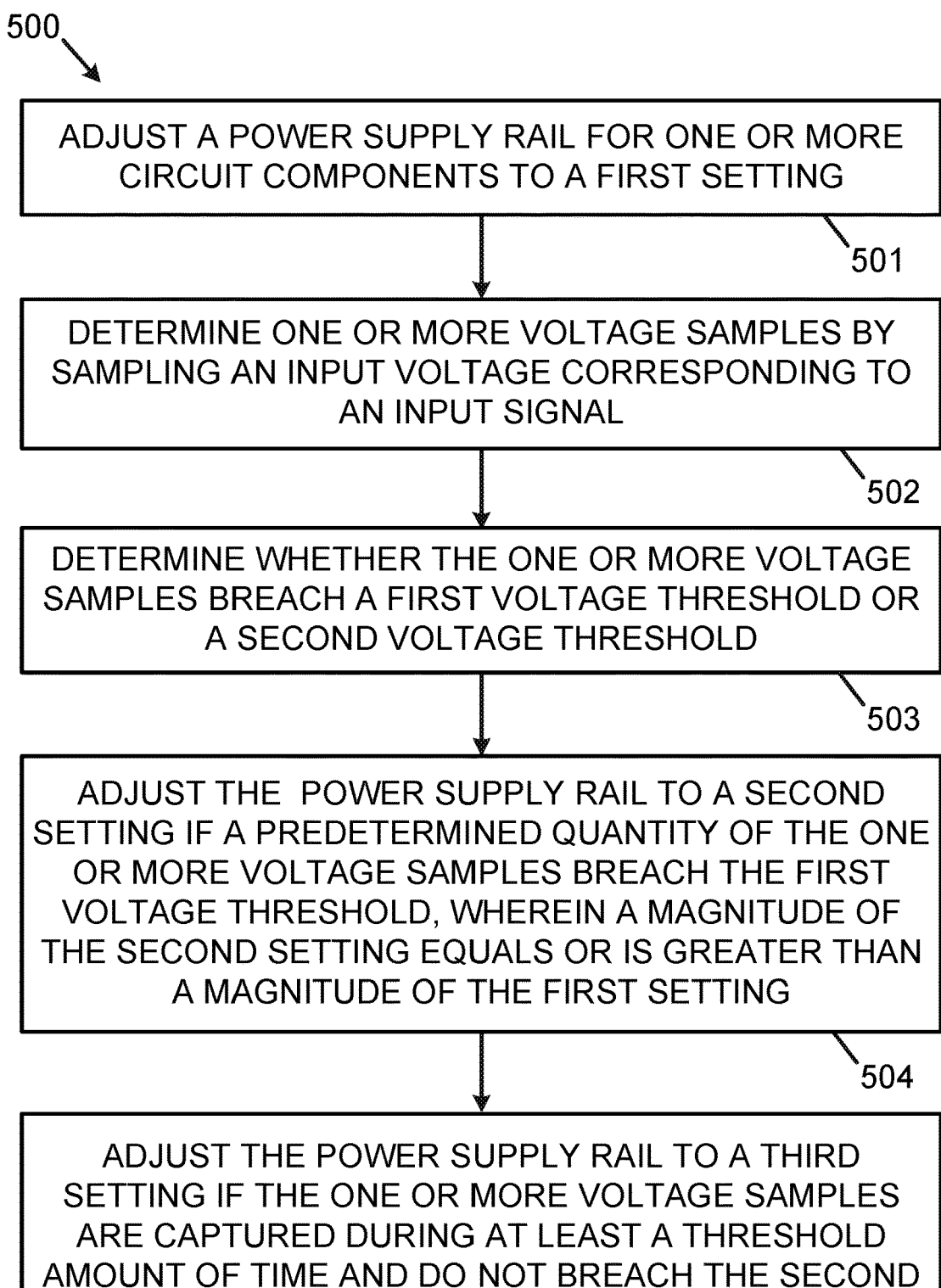

ADJUST A POWER SUPPLY RAIL FOR ONE OR MORE CIRCUIT COMPONENTS TO A FIRST SETTING

501

DETERMINE ONE OR MORE VOLTAGE SAMPLES BY SAMPLING AN INPUT VOLTAGE CORRESPONDING TO AN INPUT SIGNAL

502

DETERMINE WHETHER THE ONE OR MORE VOLTAGE SAMPLES BREACH A FIRST VOLTAGE THRESHOLD OR A SECOND VOLTAGE THRESHOLD

503

ADJUST THE POWER SUPPLY RAIL TO A SECOND SETTING IF A PREDETERMINED QUANTITY OF THE ONE OR MORE VOLTAGE SAMPLES BREACH THE FIRST VOLTAGE THRESHOLD, WHEREIN A MAGNITUDE OF THE SECOND SETTING EQUALS OR IS GREATER THAN A MAGNITUDE OF THE FIRST SETTING

504

ADJUST THE POWER SUPPLY RAIL TO A THIRD SETTING IF THE ONE OR MORE VOLTAGE SAMPLES ARE CAPTURED DURING AT LEAST A THRESHOLD AMOUNT OF TIME AND DO NOT BREACH THE SECOND VOLTAGE THRESHOLD, WHEREIN THE MAGNITUDE OF THE FIRST SETTING IS GREATER THAN A MAGNITUDE OF THE THIRD SETTING

Figures 8, 9:
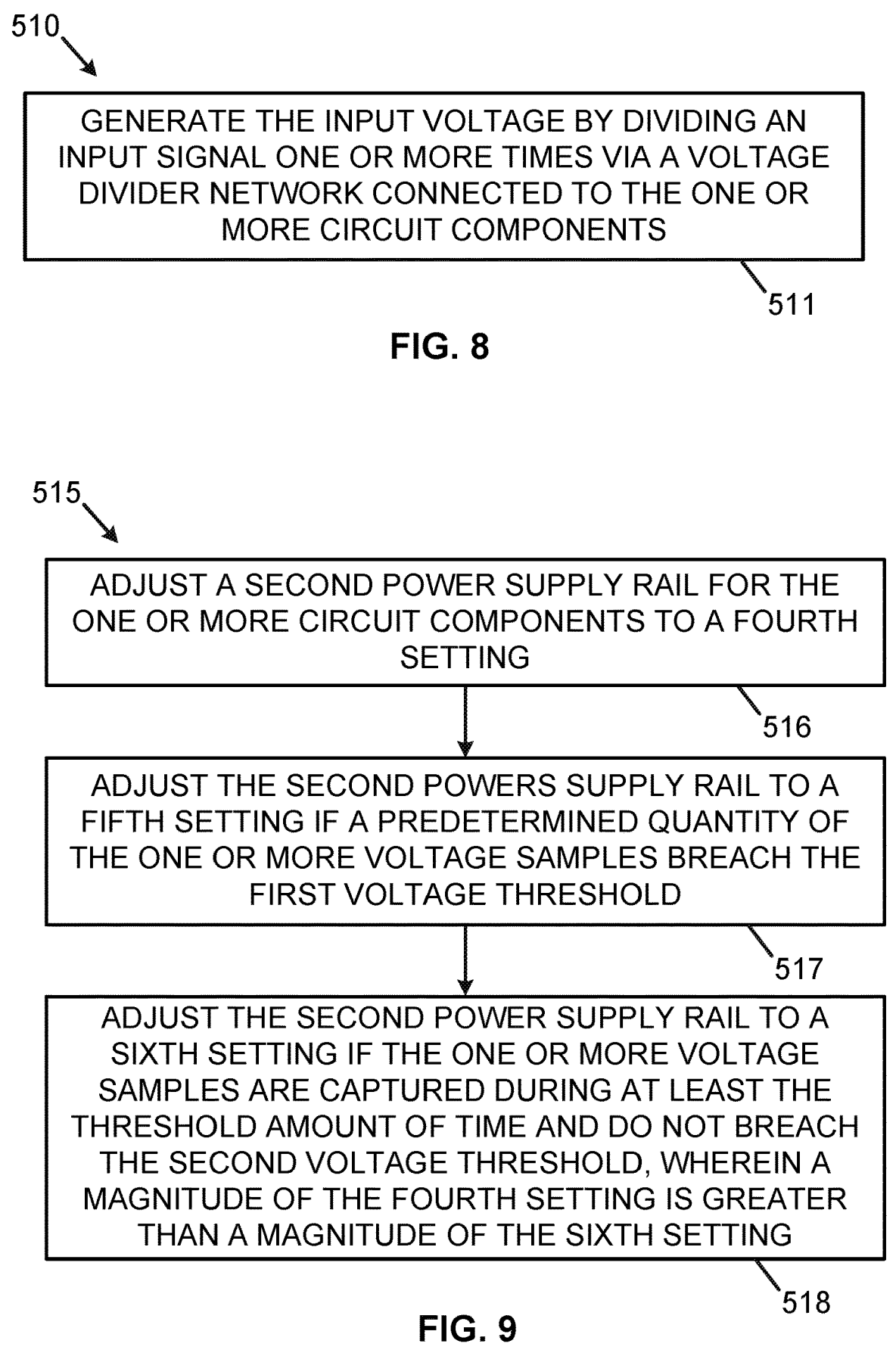

GENERATE THE INPUT VOLTAGE BY DIVIDING AN INPUT SIGNAL ONE OR MORE TIMES VIA A VOLTAGE DIVIDER NETWORK CONNECTED TO THE ONE OR MORE CIRCUIT COMPONENTS

ADJUST A SECOND POWER SUPPLY RAIL FOR THE ONE OR MORE CIRCUIT COMPONENTS TO A FOURTH SETTING

516

ADJUST THE SECOND POWERS SUPPLY RAIL TO A FIFTH SETTING IF A PREDETERMINED QUANTITY OF THE ONE OR MORE VOLTAGE SAMPLES BREACH THE FIRST VOLTAGE THRESHOLD

517

ADJUST THE SECOND POWER SUPPLY RAIL TO A SIXTH SETTING IF THE ONE OR MORE VOLTAGE SAMPLES ARE CAPTURED DURING AT LEAST THE THRESHOLD AMOUNT OF TIME AND DO NOT BREACH THE SECOND VOLTAGE THRESHOLD, WHEREIN A MAGNITUDE OF THE FOURTH SETTING IS GREATER THAN A MAGNITUDE OF THE SIXTH SETTING

Figures 10, 11:
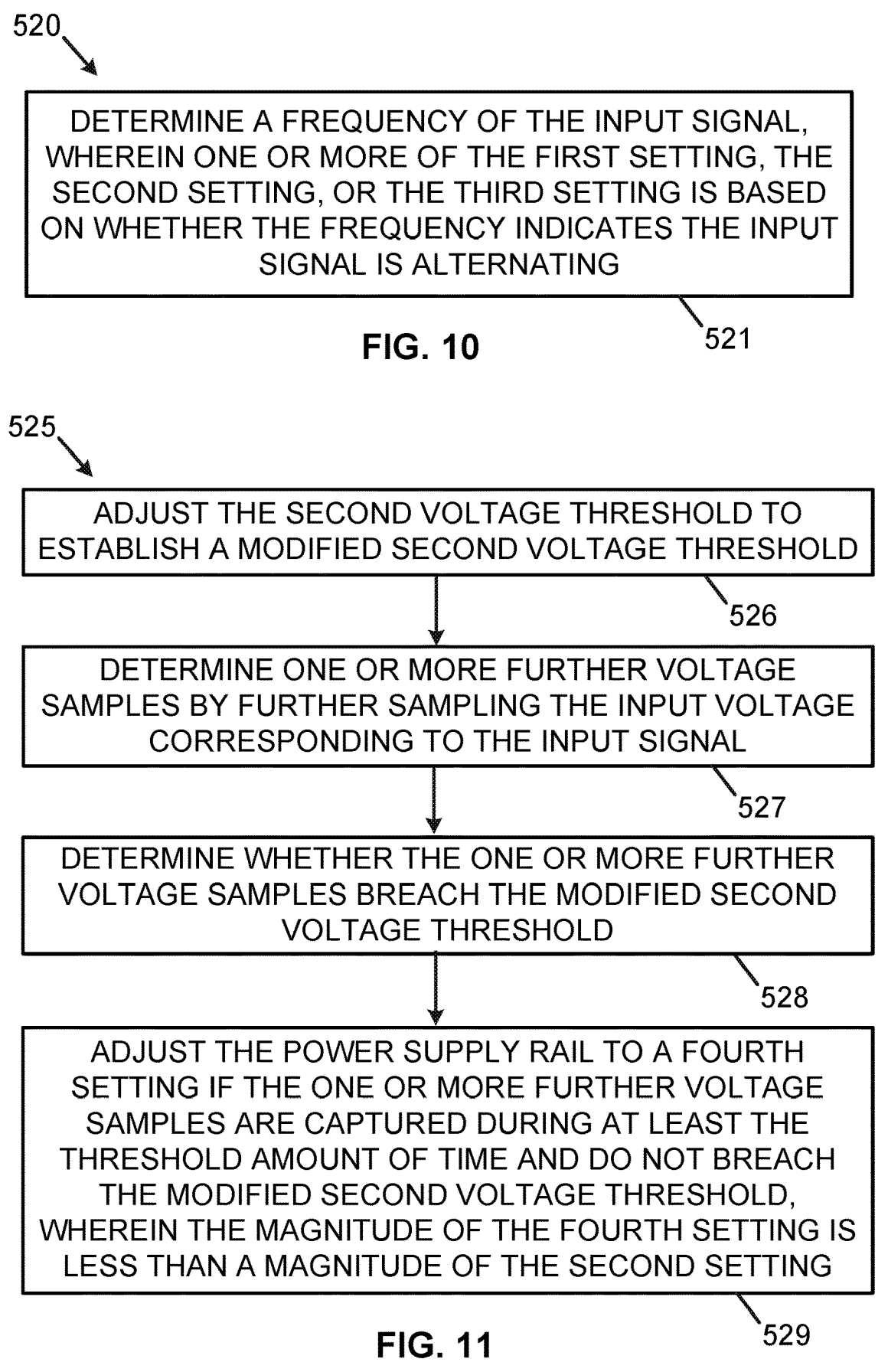

DETERMINE A FREQUENCY OF THE INPUT SIGNAL, WHEREIN ONE OR MORE OF THE FIRST SETTING, THE SECOND SETTING, OR THE THIRD SETTING IS BASED ON WHETHER THE FREQUENCY INDICATES THE INPUT SIGNAL IS ALTERNATING

ADJUST THE SECOND VOLTAGE THRESHOLD TO ESTABLISH A MODIFIED SECOND VOLTAGE THRESHOLD

526

DETERMINE ONE OR MORE FURTHER VOLTAGE SAMPLES BY FURTHER SAMPLING THE INPUT VOLTAGE CORRESPONDING TO THE INPUT SIGNAL

527

DETERMINE WHETHER THE ONE OR MORE FURTHER VOLTAGE SAMPLES BREACH THE MODIFIED SECOND VOLTAGE THRESHOLD

528

ADJUST THE POWER SUPPLY RAIL TO A FOURTH SETTING IF THE ONE OR MORE FURTHER VOLTAGE SAMPLES ARE CAPTURED DURING AT LEAST THE THRESHOLD AMOUNT OF TIME AND DO NOT BREACH THE MODIFIED SECOND VOLTAGE THRESHOLD, WHEREIN THE MAGNITUDE OF THE FOURTH SETTING IS LESS THAN A MAGNITUDE OF THE SECOND SETTING

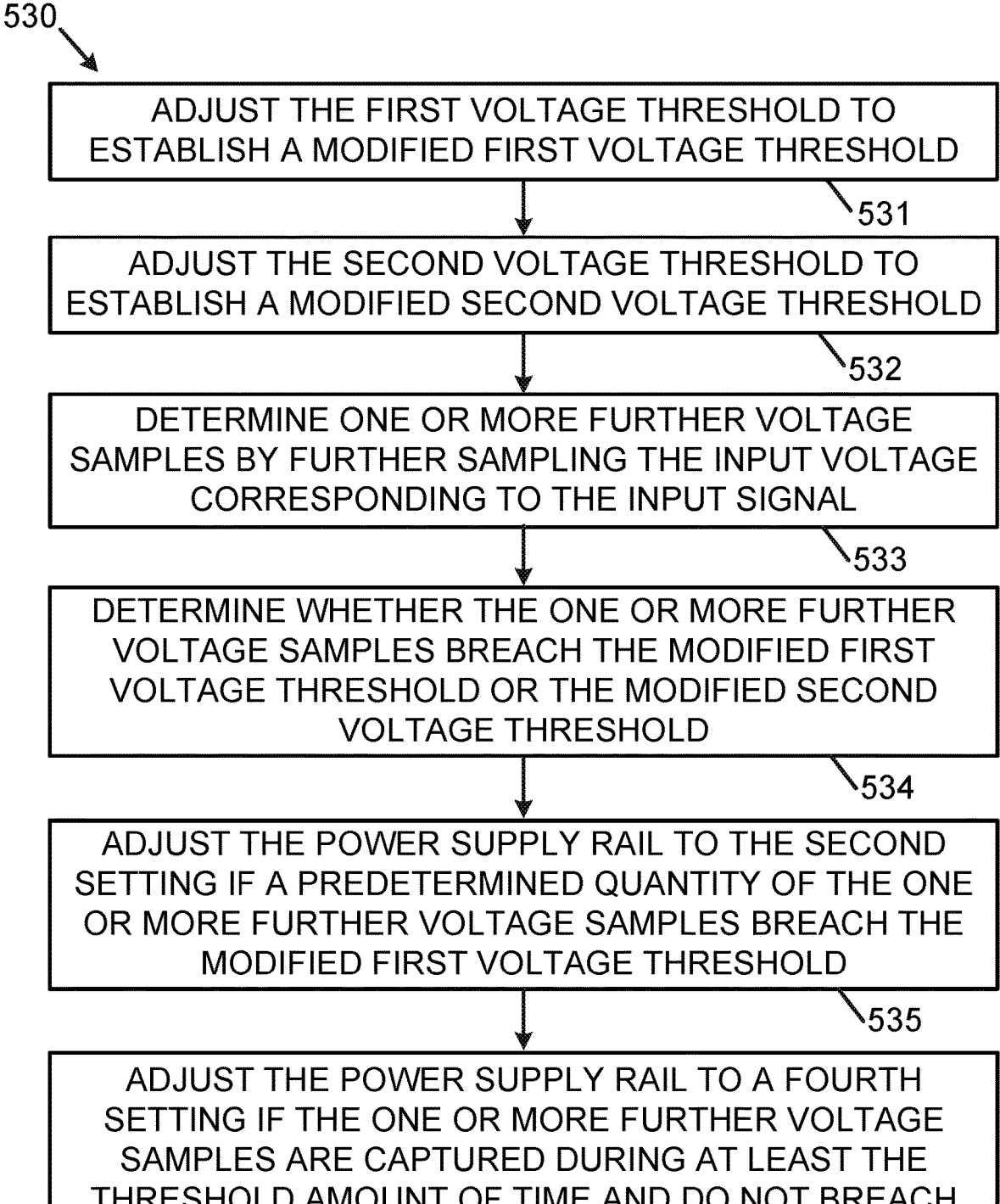

ADJUST THE FIRST VOLTAGE THRESHOLD TO ESTABLISH A MODIFIED FIRST VOLTAGE THRESHOLD

531

ADJUST THE SECOND VOLTAGE THRESHOLD TO ESTABLISH A MODIFIED SECOND VOLTAGE THRESHOLD

532

DETERMINE ONE OR MORE FURTHER VOLTAGE SAMPLES BY FURTHER SAMPLING THE INPUT VOLTAGE CORRESPONDING TO THE INPUT SIGNAL

533

DETERMINE WHETHER THE ONE OR MORE FURTHER VOLTAGE SAMPLES BREACH THE MODIFIED FIRST VOLTAGE THRESHOLD OR THE MODIFIED SECOND VOLTAGE THRESHOLD

534

ADJUST THE POWER SUPPLY RAIL TO THE SECOND SETTING IF A PREDETERMINED QUANTITY OF THE ONE OR MORE FURTHER VOLTAGE SAMPLES BREACH THE MODIFIED FIRST VOLTAGE THRESHOLD

535

ADJUST THE POWER SUPPLY RAIL TO A FOURTH SETTING IF THE ONE OR MORE FURTHER VOLTAGE SAMPLES ARE CAPTURED DURING AT LEAST THE THRESHOLD AMOUNT OF TIME AND DO NOT BREACH THE MODIFIED SECOND VOLTAGE THRESHOLD, WHEREIN THE MAGNITUDE OF THE FOURTH SETTING IS LESS THAN A MAGNITUDE OF THE SECOND SETTING

METHOD AND SYSTEM FOR DYNAMICALLY CHANGING POWER SUPPLY RAIL SETTING BASED ON INPUT VALUES

BACKGROUND

Electronic measurement devices are available in various forms. For example, some electronic measurement devices operate using electrical power received via an electrical cord connected to an electrical outlet on a wall. As another example, some electronic measurement device are battery powered. A battery or batteries of such measurement devices can be rechargeable or non-rechargeable. In any event, it is desirable to extend a charge or life of the battery or batteries powering the measurement device.

Overview

In a first implementation, a method is provided. The method includes adjusting a power supply rail for one or more circuit components to a first setting. The method also includes determining one or more voltage samples by sampling an input voltage corresponding to an input signal. Further, the method includes determining whether the one or more voltage samples breach a first voltage threshold or a second voltage threshold. Furthermore, the method includes adjusting the power supply rail to a second setting if a predetermined quantity of the one or more voltage samples breach the first voltage threshold, wherein a magnitude of the second setting equals or is greater than a magnitude of the first setting; and adjusting the power supply rail to a third setting if the one or more voltage samples are captured during at least a threshold amount of time and do not breach the second voltage threshold, wherein the magnitude of the first setting is greater than a magnitude of the third setting.

In a second implementation, a computing system is provided. The computing system comprises one or more processors, and a non-transitory computer-readable memory storing executable instructions. Execution of the executable instructions by the one or more processors causes the computing system to perform functions. The functions include adjusting a power supply rail for one or more circuit components to a first setting. The functions also include determining one or more voltage samples by sampling an input voltage corresponding to an input signal. Further, the functions include determining whether the one or more voltage samples breach a first voltage threshold or a second voltage threshold. Furthermore, the functions include adjusting the power supply rail to a second setting if any predetermined quantity of the one or more voltage samples breach the first voltage threshold or the second voltage threshold, wherein a magnitude of the second setting equals or is greater than a magnitude of the first setting, and adjusting the power supply rail to a third setting if the one or more voltage samples are captured during at least a threshold amount of time and do not breach the first voltage threshold or the second voltage threshold, wherein the magnitude of the first setting is greater than a magnitude of the third setting.

In a third implementation, a non-transitory computer-readable memory is provided. The non-transitory computer-readable memory has stored therein instructions executable by a processor to cause a computing system to perform functions. The functions include adjusting a power supply rail for one or more circuit components to a first setting. The functions also include determining one or more voltage samples by sampling an input voltage corresponding to an input signal. Further, the functions include determining whether the one or more voltage samples breach a first voltage threshold or a second voltage threshold. Furthermore, the functions include: adjusting the power supply rail to a second setting if a predetermined quantity of the one or more voltage samples breach the first voltage threshold or the second voltage threshold, wherein a magnitude of the second setting equals or is greater than a magnitude of the first setting; and adjusting the power supply rail to a third setting if the one or more voltage samples are captured during at least a threshold amount of time and do not breach the first voltage threshold or the second voltage threshold, wherein the magnitude of the first setting is greater than a magnitude of the third setting.

Other implementations will become apparent to those of ordinary skill in the art by reading the following detailed description, with reference where appropriate to the accompanying drawings.

BRIEF DESCRIPTION OF THE DRAWINGS

Example implementations are described herein with reference to the drawings.

FIG. 6, FIG. 7, FIG. 8, FIG. 9, FIG. 10, FIG. 11, and FIG. 12 show a flow chart showing a set of functions, in accordance with the example implementations.

All the figures are schematic and not necessarily to scale. Like reference numbers are used in the drawings to identify like elements unless the context or description describes otherwise.

DETAILED DESCRIPTION

I. Introduction

Figure 1:
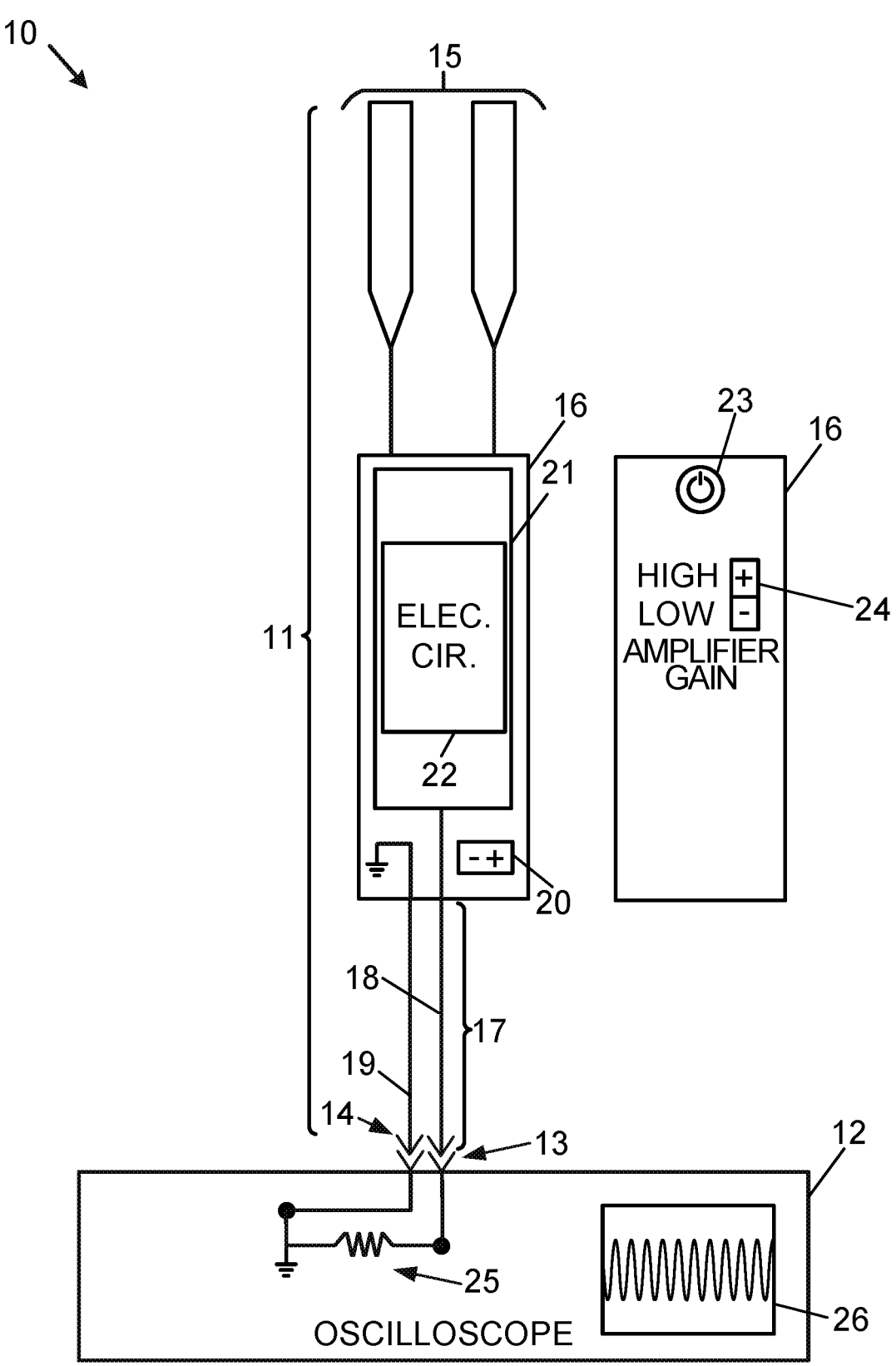
FIG. 1 shows a measurement system, in accordance with the example implementations.

This description describes several example implementations, at least some of which pertain to electronic measurement devices and/or conversion devices. As an example, at least some of the implementations pertain to improved methods and systems for controlling electrical power usage of electronic measurement devices and/or conversion devices. As another example, at least some of the implementations pertain to a high-voltage differential or single-ended probe that can be configured as a front-end for oscilloscope hardware, or devices including or operable with such a probe. In accordance with at least some of the implementations, the example devices can be battery powered. At least some battery powered devices can be configured to operate as non-battery powered when connected to a wall-mounted electrical outlet. In any event, at least some of the example implementations can increase the life of a battery and extend an amount of time the battery power device can operate on a single charge or without having to change or recharge a battery. In another respect, a size of a battery needed to operate the battery-operated electronic measurement device can be reduced.

As an example, an electronic measurement device can include a voltage meter (i.e., a volt meter), a current meter, a voltage/ohm meter (e.g., a digital volt-ohm meter), a multi-meter configured for measuring at least a voltage, a current, or a resistance, or an oscilloscope. As another example, a conversion device can include a voltage converter that converts a high voltage (e.g., a voltage greater than 100 volts) to a low voltage (e.g., a voltage less than 5 volts). As another example, a conversion device can be configured to convert an electrical current to a voltage representative of the electrical current. A conversion device can include one or more voltage dividers configured for reducing a voltage of or associated with an input signal.

In accordance with at least some implementations, the measurement devices and/or conversion devices include operational amplifiers and comparators, and/or a processor (e.g., a small microprocessor). A maximum input voltage of such measurement devices can relate to a maximum output voltage of the measurement device. Accordingly, the analog hardware in such measurement devices has to be powered by a voltage that can handle the maximum voltage span required to drive the output. In some cases however, the power supply rail may be set to a value greater than needed. This can result in higher power consumption, because the current consumed by amplifiers, comparators, processors, and a low drop-out (LDO) voltage regulator can increase when the voltage increases. For example, a power supply rail for a 5.0 volt direct current (VDC) input signal can be set to 5.4 volts, but a power supply rail for a 5.0 $V_{RMS}$ (root-mean-squared voltage) alternating current (AC) input signal can be set to ±7.4 volts.

As described in this description, the example implementations can adjust dynamic power supply rail setting(s) based on input signal(s) that are to be processed. Stated another way, the example implementations can adjust power supply rail(s) based on measured and to-be-processed input voltage (s). As further described in this description, these features can be implemented using analog hardware and/or a processor (e.g., a small microprocessor). Accordingly, the example implementations can provide ways for some devices (e.g., battery-powered devices using analog hardware or a small microprocessor) to conserve battery power different than devices that conserve power by putting a central processing unit (CPU) to sleep or to clock the CPU at a lower frequency when maximum performance of the CPU is not required. A further advantage of the implementations using the processor is that the processor can be used to perform other functions.

As an example, a measurement device arranged as a high voltage probe can be configured for measuring a 1,000 $V_{RMS}$ (i.e., 1,414 volts peak-to-peak (i.e., $V_{P-P}$)) sine wave, but many users often use the measurement device to measure lower voltages, such as 300 $V_{RMS}$ to 400 $V_{RMS}$. Power supply rails to power analog circuitry within an analog section for measuring the lower voltages can be reduced to reduce the power consumption by that circuitry.

The processor can be configured to dynamically change the power supply rail(s) for the analog section. In other implementations, the processor can be configured to control the power supply rail(s) by communicating with a voltage regulator via an $I^2C$, SPI, or another communication bus or using pulse code modulation or an analog signal.

As an example, a processor of the example implementations can be configured to continuously monitoring the input signal(s). Based on a maximum voltage or current and frequency of the input signal(s), the processor can adjust the power supply rail(s) of the analog system in order to reduce the current consumption and increase battery life or charge.

As another example, if an input voltage representing an input signal to the measurement device is 10.0 volts, a voltage required by analog circuitry to process the input signal is at least 10.0 volts to be able to process the input voltage based on the input signal. However, if the input voltage representing the input signal to the measurement device is 5.0 volts and the power supply rails to the analog circuitry are fixed at 10.0 volts, then power consumption is based on the power supply rails being supplied with the fixed 10.0 volts. The example implementations allow for reducing the power supply rails, for example to 6.0 volts (which can be sufficient for the 5.0 volt input signal. Power consumption of the measurement device can be less when the power supply rail is set to 6.0 volts.

II. Example System

FIG. 1 is a diagram showing a measurement system 10 (i.e., a measuring system). The measurement system 10 includes a measurement probe 11 and an oscilloscope 12. The measurement probe 11 is operatively connectable to the oscilloscope 12 at an oscilloscope connector 13 via a probe connector 14. The oscilloscope connector 13 and the probe connector 14 can be configured to allow the measurement probe 11 to be disconnected from and reconnected to the oscilloscope 12 one or more times.

The measurement probe 11 includes a probe tip 15 (or more simply, a tip), a housing 16, and a probe cable 17 (or more simply, a cable). The probe cable 17 can include one or more conductors. As an example, the one or more conductors can include a conductor 18 for carrying a signal representative of an input signal received at the probe tip 15. As another example, the one or more conductors can include an electrical ground connector 19.

The measurement probe 11 can include a housing 16. The housing 16 can be configured to provide support and/or protection of components of the measurement probe 11. As an example, the housing 16 can provide support and/or protection of a circuit board 21 comprising electrical circuitry 22. The circuit board 21 can include a printed circuit board, such as a single-layer or multi-layer printed circuit board.

As another example, the housing 16 can provide support and/or protection of a battery 20. The battery 20 can include one or more batteries. The battery 20 can include a rechargeable battery or a non-rechargeable battery. The rechargeable battery can include a lithium-ion battery, a nickel metal hydride battery. The non-rechargeable battery can include an alkaline battery, a lithium battery, or another type of non-rechargeable battery.

As yet another example, the housing 16 can support a button, such as an on/off button 23 (i.e., a power button) or an amplifier gain button 24. As an example, the amplifier gain button 24 can include a two-position button for selecting a high or low gain for an amplifier (e.g., an operational amplifier 56, 57 shown in FIG. 2, FIG. 3, and FIG. 4).

The oscilloscope 12 can include input impedance circuitry 25 compatible with an impedance of the probe cable 17. As an example, an impedance of the input impedance circuitry 25 can be fifty ohms. As another example, the impedance of the input impedance circuitry 25 can be one million ohms (i.e., one mega ohms, 1 MΩ). In at least some implementations, the oscilloscope 12 can include input impedance circuitry for different measurement probes (i.e., measurement probes with probe cables having different amounts of impedance to match different input impedance circuitry in the oscilloscope 12).

The oscilloscope 12 can include a display 26 for displaying waveforms representative of input signals received at or present at the probe tip 15. In contrast, in at least some embodiments, the measurement probe 11 does not include a display.

In accordance with at least some embodiments, the measurement probe 11 does not draw any current from the oscilloscope 12, but rather draws current from the battery 20. By using battery power, a measurement signal within the measurement probe is isolated from electrical power used by the oscilloscope.

Figure 2:
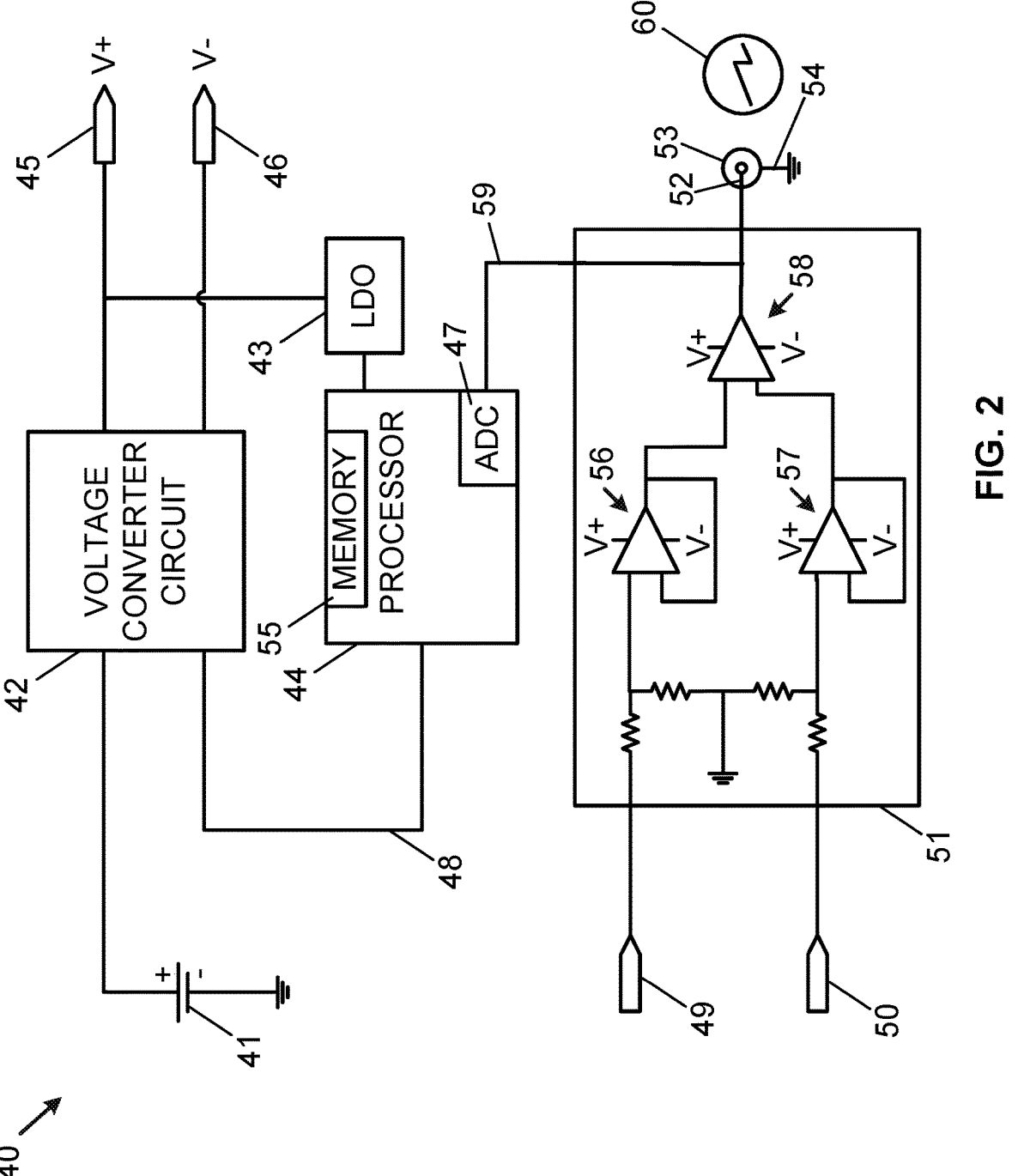
FIG. 2 is a schematic diagram of an electrical network, in accordance with the example implementations.

Next, FIG. 2 is a schematic diagram of an electrical network 40 in accordance with the example implementations. At least a portion of the electrical network 40 can be contained within a housing, such as the housing 16 (shown in FIG. 1), and/or mounted on or otherwise attached to a circuit board, such as the circuit board 21 (shown in FIG. 1). Stated another way, the electrical circuitry 22 (shown in FIG. 1) can include some or all of the electrical network 40.

The electrical network 40 includes a battery 41. As an example, the battery 41 can include a rechargeable battery or a non-rechargeable battery. Examples of those types of batteries are listed above with respect to the battery 20. The battery 41 can include one or more batteries.

The electrical network 40 includes a voltage converter circuit 42, a low drop out (LDO) 43, a processor 44, and electrical circuitry 51. The voltage converter circuit 42 is connected to the battery 41 and the processor 44. The voltage converter circuit 42 outputs a positive power supply rail 45 and a negative power supply rail 46, electrical circuits on which supply voltages for other portions of the electrical network 40 are output. In other words, the voltages of the positive power supply rail 45 and the negative power supply rail 46 can appear at other components of the electrical circuitry, such as components of the electrical circuitry 51. A voltage of the positive power supply rail 45 distributed to components of the electrical circuitry 51 is shown as "V+." A voltage of the negative power supply rail 46 distributed to components of the electrical circuitry 51 is shown as "V−." A current can arise from the voltage of a power supply rail appearing on a circuit. The voltage of the positive power supply rail 45 and the negative power supply rail 46 are direct current (DC) voltages. In accordance with at least some implementations, a single power supply rail (i.e., the positive power supply rail 45) is used to power the electrical circuitry 51.

The voltage converter circuit 42 can be arranged in various configurations. In general, the voltage converter circuit 42 comprises a DC-DC converter, such as an isolated or non-isolated DC-DC converter. More particularly and as an example, the voltage converter circuit 42 can be arranged as a buck converter, a boost converter, or a buck-boost converter. The buck converter can output a voltage less than an input voltage. The boost converter can output a voltage greater than or equal to an input voltage. The buck-boost converter (e.g., a CUK converter) can output a voltage less than, equal to, or greater than an input voltage.

In accordance with at least some embodiments, the voltage converter circuit 42 includes a single voltage converter that outputs voltage for both the positive power supply rail 45 and the negative power supply rail 46. In accordance with at least some other embodiments, the voltage converter circuit 42 includes a first voltage converter that outputs voltage for the positive power supply rail 45 and a second voltage converter that outputs voltage for the negative power supply rail 46.

The low drop out 43 is a voltage regulator. In at least some embodiments, the low drop out 43 provides power to the processor 44. In at least some other embodiments, the battery 41 provides power to the processor 44 without or in addition to the low drop out 43.

The processor 44 (e.g., one or more processors) can be arranged in any of a variety of configurations. For example, the processor 44 can comprise a central processor unit (CPU), a microcontroller, a microprocessor, or system on chip (SOC). The processor 44 can include and/or be connected to a memory 55. As discussed, the processor 44 can be powered by voltage provided by the low drop out 43 or the battery 41. In an alternative arrangement, the processor 44 can be powered by a voltage supplied by the positive power supply rail 45.

The electrical network 40 includes an analog-to-digital converter (ADC) 47. In at least some implementations, the processor 44 contains the ADC 47. In at least some other implementations, the ADC 47 is remote from the processor 44 (e.g., the ADC 47 can comprise an integrated circuit (IC) separate from the processor 44). The ADC 47 can be selected based on an expected greatest input voltage to the ADC 47.

In accordance with at least some embodiments, the measurement system 10 includes peak capture circuitry to detect a peak voltage value of an alternating input signal. In such implementations, the ADC 47 can be relatively slow as compared to measurement system that does not have peak capture circuitry (assuming the measurement system is configured to detect a peak voltage value of an alternating input signal). When adjusting a power supply rail to a different setting, the processor can determine the setting by determining a sum of the voltage step 107 and the peak voltage value measured by the measurement system 10 and/or the processor 44.

The electrical circuitry 51 can be configured to divide the input signal received from the positive analog input 49 and the negative analog input 50 so that the input voltage provided by the electrical circuitry 51 to the ADC 47 does not exceed the expected greatest input voltage to the ADC 47 and/or the processor 44. As an example, if the processor 44 operates at 3.3 volts, the electrical circuitry 51 can be configured to divide the input signal to be within a range of 0.0 to 3.3 volts. In at least some implementations, the electrical circuitry 51 can be configured to divide the input signal to a voltage within range of 0.0 volts and a voltage equal to the difference of the maximum operating voltage of the ADC 47 or the processor 44 and a fixed offset voltage (e.g., a typical amount of voltage dropped by a diode, such as 0.3 volts or 0.7 volts).

As another example, the input signal provided by the positive analog input 49 and the negative analog input 50 to the electrical circuitry 51 can be relatively high (e.g., by a factor of 100 or more) with respect to the operating voltage of the processor 44. The electrical circuitry 51 can divide that input signal to within a range of 0.0 volts to the operating voltage of the processor 44. As an example, the electrical circuitry 51 can divide a 1,000.0 volt analog input signal down to 2.0 volts.

On the other hand, if the measurement system 10 and/or the electrical circuitry 51 is for measuring 5.0 volt logic circuits, the electrical circuitry 51 may not need a voltage divider to divide the input signal if the input signal voltage is below a 5.0 volt signal used to power the processor 44.

The electrical network 40 can include a control interface 48 that is operatively connected to the voltage converter circuit 42 and the processor 44. In general and as an example, the control interface 48 can include a digital control bus. More particularly, and as an example, the control interface 48 can include an inter-integrated circuit (i.e., I2C or I²C) according to an I²C specification. As another example, the control interface 48 can include a serial peripheral interface (i.e., SPI) configured to communicate between multiple microcomputers or digital interface. As yet another example, the control interface 48 can include interface based on the I2C, such as the ACCESS.bus, VESA Display Data Channel (DDC), the System Management Bus (SMBus) or the Power Management Bus (PMBus), or some other interface based on I2C.

As an example, control interface 48 can carry two bytes of binary values to represent a voltage setting for the voltage converter circuit. The range of those binary values in hexadecimal numbers is $0000 to $FFFF can represent a lowest voltage setting (e.g., 0.0 volts) and a greatest voltage setting (e.g., 10.0 volts). The two bytes of binary values in decimal numbers is 0 to 65,535. Based on the foregoing examples, starting from the binary values 0000 0000 0000 0000, each incremental bit equals 0.00015259 volts (i.e., 0.15259 millivolts) such that the binary values 1111 1111 1111 1111 equals 10.0 volts. The voltage converter circuit 42 can interpret the binary values and adjust the positive power supply rail 45 and the negative power supply rail 46 to a setting corresponding to the binary values.

In accordance with at least some implementations, the control interface 48 can carry an analog control signal from a digital-to-analog converter. The processor 44 can determine the desired output voltage and provide digital values representative of the desired output voltage to the digital-to-analog converter. An analog output of the digital-to-analog converter is carried over the control interface 48 for interpretation by the voltage converter circuit 42.

The electrical network 40 can include a positive analog input 49 and a negative analog input 50. An input signal can be applied to and/or received by the positive analog input 49 and the negative analog input 50. The input signal can be a voltage or a current.

In accordance with at least some implementations, the positive analog input 49 and the negative analog input 50 are arranged as a differential input. The differential input can have high impedance with respect to an electrical ground. The differential input allows for measuring differential signals, such as signals on a controller area network (CAN) bus within a vehicle.

In accordance with at least some implementations, the positive analog input 49 and the negative analog input 50 are arranged as a single-ended input. The single-ended input allows for measuring single-ended signals, such as serial data signals referenced to ground with a vehicle. As an example, the negative analog input 50 can be connected to and/or in contact with an electrical ground and the positive analog input 49 can be connected to and/or in contact with an electrical input to be measured. As yet another example, when the negative analog input 50 is connected physically or at least electrically to an electrical ground (e.g., an electrical ground 54), the positive analog input 49 and the negative analog input 50 are arranged as a single-ended input. As yet another example, a shunt resistor can be positioned between the positive analog input 49 and the negative analog input 50 to allow for measuring, effectively, a current in the shunt resistor.

As an example, each of the positive analog input 49 and the negative analog input 50 can include a conductive tip configured for contacting an object to be measured. The tip can be removable and replaced with a different tip. Examples of a tip include an alligator clip, a mini-test clip, a banana plug, a spade lug, an extended fine point tip, a piercing tip, or some other type of tip.

The positive analog input 49 and the negative analog input 50 lead to and/or are connected to electrical circuitry 51. In accordance with at least some embodiments, the electrical circuitry 51 can include analog circuitry. As an example, the analog circuitry can include one or more one or more operational amplifiers (e.g., an operational amplifier 56, 57, 58). As another example, the analog circuitry can include a buffer amplifier including the operational amplifier 56 or a buffer amplifier including the operational amplifier 57. In at least some implementations, the buffer amplifier includes a junction field effect transistor (J-FET) amplifier. As another example, the analog circuitry can include a differential amplifier including the operational amplifier 58. As yet another example, the analog circuitry can include one or more comparators, one or more analog buffers (e.g., one or more voltage buffers and/or one or more current buffers), one or more filters, and/or one or more analog switches. One or more of the example analog components can be implemented using discrete components, such as transistors, resistors, and/or diodes. As an example, the electrical circuitry 51 can include resistors 63, 64, 65, 66 configured as an input voltage divider and an input impedance with respect to the positive analog input 49 and the negative analog input 50. The arrangement of the resistive input impedance can be used for implementations in which the input signal applied to the positive analog input 49 and the negative analog input 50 is a direct current input signals or an input signal less than a few kilohertz. The input signal having a frequency less than a few kilohertz can include a pulsed direct current signal or an alternating current signal.

As still yet another example, the analog circuitry can include a double rectifier and/or a rectifier bridge with operation amplifiers. In at least some implementations, the ADC 47 is sufficiently fast such that the rectifier is not needed for alternating input signals. Such ADC could output a digital signal representative of the curve of the alternating input signal.

An analog output 52 of the electrical circuitry 51 can be connected to a measurement device 60 via a connector 53. The analog output 52 is ground referenced (via the electrical ground 54) to the measurement device 60. As an example, the measurement device 60 can include an oscilloscope or a meter. A voltage on the analog output 52 can be equal to a voltage on the ADC input circuit 59.

In accordance with at least some embodiments, the electrical circuitry 51 can include digital circuitry. As an example, the digital circuitry can include one or more embedded microcontrollers. In the embodiments including multiple embedded microcontrollers, those microcontrollers can have a wide range of operating voltage requirements.

Figure 3:
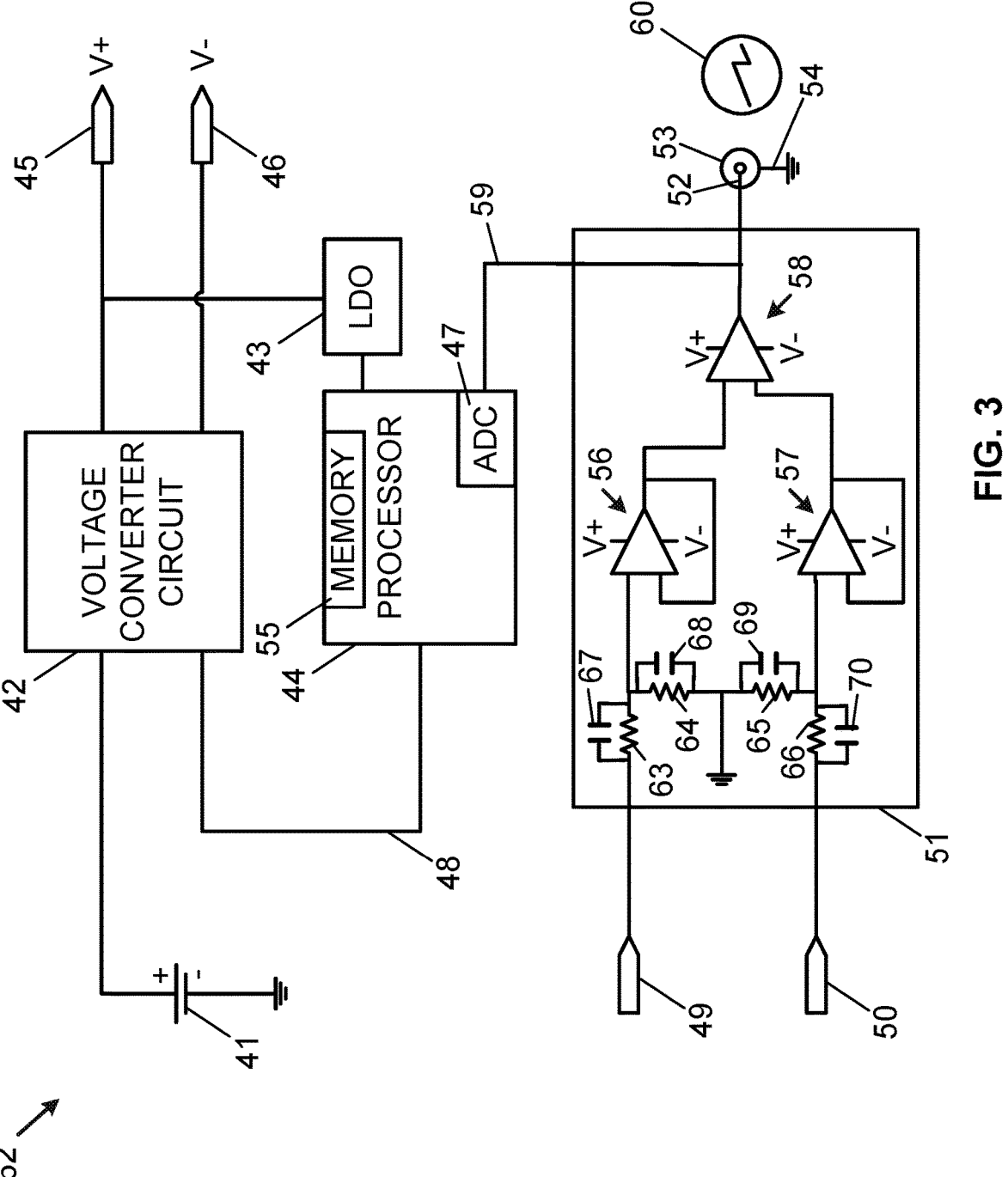
FIG. 3 is a schematic diagram of an electrical network, in accordance with the example implementations.

Next, FIG. 3 is a schematic diagram of an electrical network 62 in accordance with the example implementations. The electrical network 62 is similar to the electrical network 40 shown in FIG. 2 except that the electrical network 62 includes a capacitor 67, 68, 69, 70 in parallel with the resistor 63, 64, 65, 66, respectively. The resistor 63, 64, 65, 66 and the capacitor 67, 68, 69, 70 function as a voltage divider and an input impedance with respect to the positive analog input 49 and the negative analog input 50. The arrangement of the resistive and capacitive input impedance can be used for implementations in which the input signal applied to the positive analog input 49 and the negative analog input 50 has a frequency greater than or equal to a few kilohertz (as well as for direct current input signals and input signals less than a few kilohertz). The input signal having a frequency less than, greater than or equal to a few kilohertz can include a pulsed direct current signal or an alternating current signal.

Figure 4:
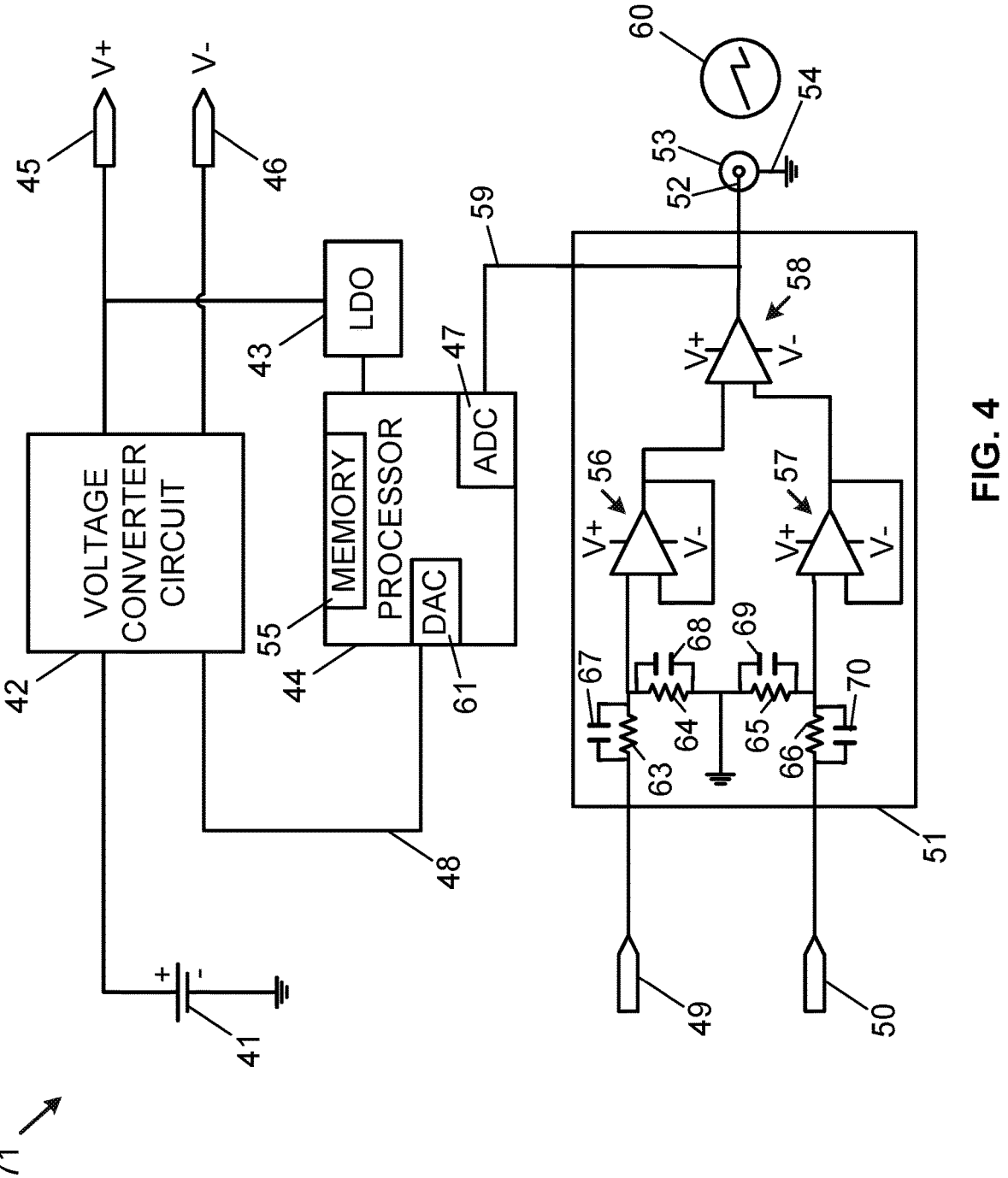
FIG. 4 is a schematic diagram of an electrical network, in accordance with the example implementations.

Next, FIG. 4 is a schematic diagram of an electrical network 71 in accordance with the example implementations. The electrical network 71 is similar to the electrical network 62 shown in FIG. 3 except that the electrical network 71 includes a digital-to-analog converter (DAC) 61. The digital-to-analog converter 61 can include one or more digital-to-analog converters. One or more of the digital-to-analog converters can be integrated within the processor 44 or distributed throughout the electrical network 71 remote from the processor 44. In at least some other implementations, the digital-to-analog converter 61 is remote from the processor 44 (e.g., the digital-to-analog converter 61 can comprise an integrated circuit (IC) separate from the processor 44).

A person having ordinary skill in the art will understand that the electrical circuitry 51 within the electrical network 40, 62, 71 can include component(s) for clamping and/or electrostatic discharge (ESD) protection. Such component(s) can be located in proximity to the positive analog input 49 and the negative analog input 50 or to the analog output 52. As an example, the aforementioned components can include a diode, a transient voltage suppression diode, a reverse bias Zener diode, a varistor or some other component for clamping or ESD protection.

III. Example System Components

1 Processor

A processor, such as the processor 44 (shown in FIG. 2) or any other processor discussed in this description, can include one or more processors. Any processor discussed in this description can thus be referred to as "at least one processor" and/or "one or more processors." Additionally, any processor discussed in this description can include a general purpose processor (e.g., an INTEL® single core microprocessor), and/or a special purpose processor (e.g., a digital signal processor, an embedded processor, or an application specific integrated circuit (ASIC) processor). Furthermore, any processor discussed in this description can include or be operatively connected to a memory controller that controls a flow of data going to and from a memory, such as the memory 55 (shown in FIG. 2).

Any processor discussed in this description can be operable to execute computer-readable program instructions (CRPI). Any CRPI discussed in this description can, for example, include assembler instructions, machine instructions, machine dependent instructions, microcode, firmware instructions, state-setting data, and/or either source code or object code written in one or any combination of two or more programming languages. As an example, a programming language can include an object oriented programming language such as Java, Python, or C++, or a procedural programming language, such as the "C" programming language. Any processor discussed in this description can be operable to execute hard-coded functionality in addition to or as an alternative to software-coded functionality (e.g., via CRPI). In at least some implementations, the processor 44 is a specific processor that is programmed to perform any function(s) described in this description as being performed with respect to a module.

An embedded processor refers to a processor with a dedicated function or functions within a larger electronic, mechanical, pneumatic, and/or hydraulic device, and is contrasted with a general purpose computer. The embedded processor can include a central processing unit chip used in a system that is not a general-purpose workstation, laptop, or desktop computer. In some implementations, the embedded processor can execute an operating system, such as a real-time operating system (RTOS). As an example, the RTOS can include the SMX® RTOS developed by Micro Digital, Inc., such that the embedded processor can include (a) an advanced RISC (reduced instruction set computer) machine (ARM) processor (e.g., an ATSAMS70-DTE processor provided by the Atmel Corporation, San Jose, California), or (b) a COLDFIRE® processor (e.g., an MCF52259 processor) provided by NXP Semiconductors N.V., Eindhoven, Netherlands. A general purpose processor, a special purpose processor, and/or an embedded processor can perform analog signal processing and/or digital signal processing.

2. Memory

A memory, such as the memory 55 or any other memory discussed in this description, can include one or more memories. Any memory discussed in this description can thus be referred to as "at least one memory" and/or "one or more memories." A memory can include a non-transitory memory, a transitory memory, or both a non-transitory memory and a transitory memory. A non-transitory memory, or a portion thereof, can be located within or as part of a processor (e.g., within a single integrated circuit chip). A non-transitory memory, or a portion thereof, can be separate and distinct from a processor.

A non-transitory memory can include a tangible, volatile or non-volatile, storage component, such as an optical, magnetic, organic or other memory or disc storage component. Additionally or alternatively, a non-transitory memory can include or be operable as a random-access memory (RAM), a read-only memory (ROM), a programmable read-only memory (PROM), an erasable programmable read-only memory (EPROM), a flash memory, an electrically erasable programmable read-only memory (EEPROM), or a compact disk read-only memory (CD-ROM). The RAM can include static RAM or dynamic RAM. A non-transitory memory can be operable as a removable storage device, a non-removable storage device, or a combination thereof. A removable storage and/or a non-removable storage device can include a magnetic disk device such as a flexible disk drive or a hard-disk drive (HDD), an optical disk drive such as a compact disc (CD) drive and/or a digital versatile disk (DVD) drive, a solid state drive (SSD), or a tape drive.

A transitory memory can include, for example, CRPI or a module provided over a communication network to a processor (e.g., the processor 44) or a memory controller discussed above.

A "memory" can be referred to by other terms such as a "computer-readable memory," a "computer-readable medium," a "computer-readable storage medium," a "data storage device," a "memory device," "computer-readable media," a "computer-readable database," "at least one computer-readable medium," or "one or more computer-readable mediums." Any of those alternative terms can be preceded by the prefix "transitory" if the memory is transitory or "non-transitory" if the memory is non-transitory. For a memory including multiple memories, two or more of the multiple memories can be the same type of memory or different types of memories.

3. Memory Content

The example implementations can determine, generate, store (e.g., write into a memory), transmit, read, receive, and/or otherwise use a variety of computer-readable data. At least some of the computer-readable data can be stored in a memory, such as the memory 55.

Figure 5:
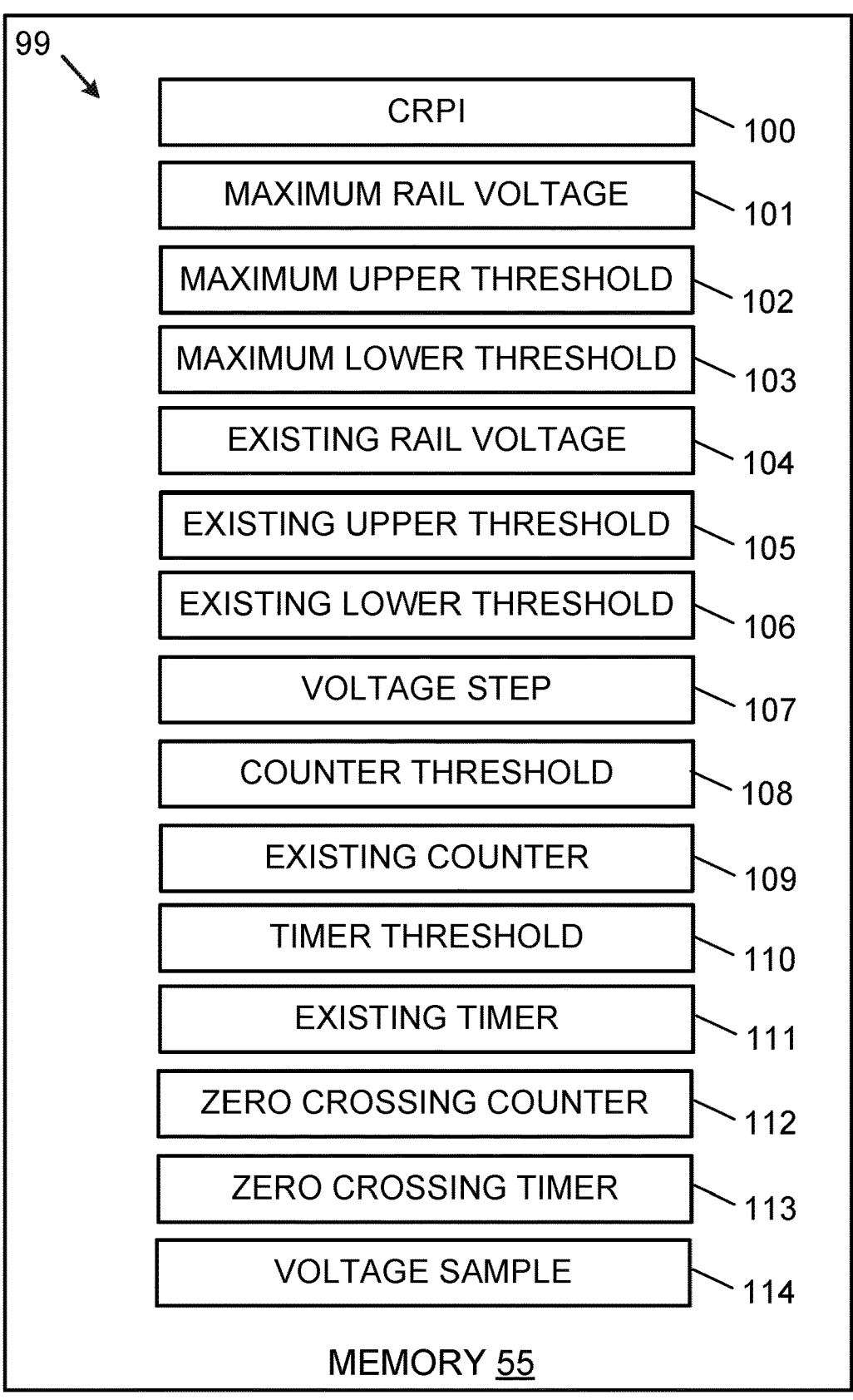
FIG. 5 shows example data stored in a memory, in accordance with the example implementations.

FIG. 5 shows data 99 stored in a memory (e.g., the memory 55), in accordance with the example implementations. As shown in FIG. 5, the data 99 can include one or more from among: computer-readable program instructions (CRPI) 100, a maximum rail voltage 101, a maximum upper threshold 102, a maximum lower threshold 103, an existing rail voltage 104, an existing upper threshold 105, an existing lower threshold 106, a voltage step 107, a counter threshold 108, an existing counter, 109, a timer threshold 110, an existing timer 111, a zero crossing counter 112, a zero crossing timer 113 or a voltage sample 114.

Examples describing use of those that data are provided throughout the description to give additional context for the data. For example, the maximum rail voltage 101, the maximum upper threshold 102, and the maximum lower threshold 103 can equal a voltage B, a voltage C, and a voltage D, respectively, as represented in a graph 601 in FIG. 13. As another example, the existing rail voltage 104, the existing upper threshold 105, and the existing lower threshold 106 (for some instance of operating the measurement system 10 and/or the electrical network 40) can equal a voltage C, a voltage D, and a voltage E, respectively, as shown in a graph 602 shown in FIG. 13.

The CRPI 100 are executable by the processor 44. Some portions of the data 99 can be stored within the CRPI 100. As an example, one or more of the maximum rail voltage 101, the maximum upper threshold 102, or the maximum lower threshold 103 can be stored within the CRPI 100. Alternatively, the processor 44 can execute the CRPI 100 to read one or more of the maximum rail voltage 101, the maximum upper threshold 102, or the maximum lower threshold 103 from a portion of the memory 55 not containing the CRPI 100. The processor 44 can execute the CRPI 100 to perform functions described in this description as being performed by the processor 44.

In at least some implementations, the memory 55 can include a separate instance of the maximum rail voltage 101, the maximum upper threshold 102, or the maximum lower threshold 103 for each power supply rail in the measurement system 10 and/or the electrical network 40. In at least some other implementations, the memory 55 can include a single instance of the maximum rail voltage 101, the maximum upper threshold 102, or the maximum lower threshold 103 for multiple power supply rails in the measurement system 10 and/or the electrical network 40. In accordance with at least some implementations, the maximum rail voltage 101 can indicate a default rail voltage the processor sets a power supply rail when the measurement system 10 powers on and/or when one or more samples of the input signal have breached the existing upper threshold 105.

In accordance with at least some implementations, the maximum rail voltage exceeds the input signal to prevent clipping of the input signal.

The existing rail voltage 104 can include data indicating voltage settings for one or more power supply rails. For example, the existing rail voltage 104 can indicate an existing rail voltage setting corresponding to the positive power supply rail 45. As another example, the existing rail voltage 104 can indicate a first existing rail voltage setting corresponding to the positive power supply rail 45 and a second existing rail voltage setting corresponding to the negative power supply rail 46.

The existing rail voltage 104 is a voltage setting currently in use by the processor 44 and/or the measurement system 10. As an example, an existing rail voltage for the positive power supply rail 45 can be positive 4.7 VDC (i.e., +4.7 VDC) and an existing rail voltage for the negative power supply rail 46 can be negative 4.7 VDC (i.e., −4.7 VDC). In at least some implementations, a single existing rail voltage (e.g., 4.7 VDC) can be used for the positive power supply rail 45 and the negative power supply rail 46, and the voltage converter circuit 42 is configured to use the single existing rail voltage as a voltage magnitude for setting voltages of the positive power supply rail 45 and the negative power supply rail 46 at a positive voltage equal to the voltage magnitude and a negative voltage equal to the voltage magnitude, respectively.

The existing upper threshold 105 includes a threshold value for comparison to samples of the input signal. The processor 44 can make those comparisons to determine whether any of the samples of the input signal breach the existing upper threshold 105.

The existing lower threshold 106 includes a threshold value for comparison to samples of the input signal. The processor 44 can make those comparisons to determine whether any of the samples of the input signal breach the existing lower threshold 106.

In accordance with at least some implementations, the memory 55 can include a separate instance of the existing rail voltage 104, the existing upper threshold 105, or the existing lower threshold 106 for each power supply rail in the measurement system 10 and/or the electrical network 40. In accordance with at least some other implementations, the memory 55 can include a single instance of the existing rail voltage 104, the existing upper threshold 105, or the existing lower threshold 106 for multiple power supply rails in the measurement system 10 and/or the electrical network 40.

In at least some implementations, when the processor 44 sets the positive power supply rail 45 and the negative power supply rail 46 to a maximum setting, the existing rail voltage 104, the existing upper threshold 105, and the existing lower threshold 106 can be set to (i.e., equals) the maximum rail voltage 101, the maximum upper threshold 102, and the maximum lower threshold 103, respectively.

The voltage step 107 can contain a data value indicating a voltage. The processor 44 can decrease the positive power supply rail 45 and the negative power supply rail 46 when adjusting those rails to reduce power consumption by the measurement system 10 and/or the electrical network 40. As an example, the voltage step can be 0.1 volts such that power supply rails set to +3.0 volts and −3.0 volts respectively can be adjusted to +2.9 volts and −2.9 volts respectively.

The counter threshold 108 can include a value indicating a quantity of voltage samples, such as five hundred samples, one thousand samples, or two thousand samples. The existing counter 109 can indicate a quantity of consecutive samples of the ADC 47 most recently determined by the processor 44 that do not exceed a threshold, such as the existing upper threshold 105 or the existing lower threshold 106.

In at least some implementations, the counter threshold 108 can include multiple counter threshold values, such as a first counter threshold value (e.g., one sample) corresponding to the existing upper threshold 105 and a second counter threshold value (e.g., five hundred samples) corresponding to the existing lower threshold 106.

The existing counter 109 can include one or more existing counter values. For example, the existing counter 109 can include a first existing counter value that indicates a count of consecutive samples of the input voltage corresponding to the input signal that do not exceed the existing upper threshold 105. A value of the first existing counter value can be compared to the first counter threshold value discussed above. As another example, the existing counter 109 can include a second existing counter value that indicates a count of consecutive samples of the input voltage corresponding the input signal that do not exceed the existing lower threshold 106. A value of the second existing counter value can be compared to the second counter threshold value discussed above. The processor 44 can be configured to adjust the power supply rail in response to determining the first existing counter value exceeds the first counter threshold or the second existing counter value exceeds the second counter threshold.

The timer threshold 110 can include one or more timer thresholds. Each timer threshold can correspond to one or more existing timers of the existing timer 111 discussed below. Each timer threshold can indicate a quantity of time, such as one second, two seconds, or five seconds.

As an example, a single timer threshold of the timer threshold 110 can correspond to an existing timer corresponding to whether input voltage samples have breached the maximum upper threshold 102 or the maximum lower threshold 103.

As another example, the timer threshold 110 can include a first timer threshold and a second timer threshold. The first timer threshold can correspond to a first existing timer discussed below with respect to the existing timer 111. The second timer threshold can correspond to a second existing timer discussed below with respect to the existing timer 111.

The existing timer 111 can include one or more existing timers. Each existing timer of the existing timer 111 can indicate an amount of time indicated by an existing timer, such as an amount of time since the existing timer has been reset and none of the input voltage samples since the existing timer has been reset has not breached an existing threshold (e.g., the existing upper threshold 105 or the existing lower threshold 106). As an example, the existing timer 111 can indicate a quantity of time counted by a timer since a sample output by the ADC 47 exceeded a threshold, such as the existing upper threshold 105 or the existing lower threshold 106.

In accordance with implementations in which the existing timer 111 includes more than one existing timer, the existing timer 111 can include a first existing timer and a second existing timer. The first existing timer can indicate how much time has passed since the first existing timer has been reset has not breached the existing upper threshold 105, and second existing timer can indicate how much time has passed since the second existing timer has been reset has not breached the existing lower threshold 106. The processor 44 can be configured to reset both the first existing timer and the second existing timer in response to determining that either the first existing timer or the second existing timer is to be reset.

In at least some implementations, the timer threshold 110 can include a first timer threshold (e.g., one microsecond) for the existing upper threshold 105 and a second timer threshold (e.g., one second) for the existing lower threshold 106. In accordance with those implementations, the existing timer 111 can include a first existing timer for comparison to the first timer threshold and a second existing timer for comparison to the second timer threshold. Furthermore, in accordance with those implementations, the first timer threshold can be shorter than the second timer threshold so that the processor 44 will adjust the power supply rail to a voltage equal to the maximum rail voltage 101 more quickly when the existing upper threshold 105 is exceeded as compared to the processor 44 reducing a voltage of the power supply rail in response to consecutive values of the input signal to the ADC 47 being lower than the existing lower threshold 106. This is a way to implement a filter. In other words, if the input signal increases above a voltage on a power supply rail or the existing upper threshold 105, then the voltage on the power supply rail is increased immediately, but if the input signal decreases below the existing lower threshold 106, a filter is applied to delay decreasing the voltage on the power supply rail.

The existing counter 109 and/or the existing timer 111 can be used to implement a filter (e.g., a delay) in adjusting a voltage level on a power supply rail. As an example, the existing counter 109 can indicate a quantity of samples (e.g., 500 samples, 1,000 samples or 1,500 samples) of the input signal to count before adjusting a voltage on a power supply rail. Other examples of the quantity of samples indicated by the existing counter 109 are also possible. As another example, the existing timer 111 can indicate an amount of time (e.g., 5.0 seconds, 10.0 seconds, 20.0 seconds, or 30.0 seconds) of sampling the input signal before adjusting a voltage on a power supply rail. Other examples of the amount of time indicated by the existing timer 111 are also possible.

The zero crossing counter 112 can indicate a quantity of times the processor 44 detects that the input signal crosses a 0.0 voltage level during an amount of time indicated by the zero crossing timer 113. The processor 44 can execute the CRPI 100 to determine a frequency of the input signal by dividing the value of the zero crossing counter 112 (e.g., 1,000 crossing) by the value of the zero crossing timer 113 (e.g., 1.0 seconds) to determine a frequency of the input signal (e.g., 1.0 kHz). As an example, the zero crossing timer 113 can indicate an amount of time since the processor 44 last determined a frequency of the input signal. The processor 44 can be configured to adjust the zero crossing counter 112 by a particular voltage if the processor 44 detects that the input signal includes a direct current component.

The voltage sample 114 can indicate one or more voltage samples determined by the processor 44. For example, the one or more voltage samples can include sample(s) the processor 44 determines by converting a digital signal output by the ADC 47.

For purposes of this description, at least some of the example memory content described above or elsewhere in this description can be embodied in computer-readable program instructions executable by the processor 44.

IV. Example Operation

1. First Function Set

Next, FIG. 6 is a flow chart showing a function set 400 (e.g., a set of function(s)) of a method in accordance with the example implementations. The functions of the function set 400 are shown in a block 401, 402, 403, 404, 405, 406, 407, 408. Two or more functions and/or portions of two or more functions of the function set 400 can be performed at the same time. Additionally or alternatively, one or more of the functions of the function set 400 can performed concurrently on multiple power supply rails, such as the positive power supply rail 45 and the negative power supply rail 46. One or more functions of the function set 400 can be performed as part of performing some other method described in this description. One or more other functions described in this description can performed while performing a method that includes performing one or more functions of the function set 400.

Block 401 includes powering on a measurement system, such as the measurement system 10. As an example, powering on the measurement system can include installing a battery (e.g., the battery 20) within and/or connecting the battery to the measurement system. As another example, powering on the measurement system can include pressing an on/off button of the measurement system, such as the on/off button 23.

Next, block 402 includes initiating a power supply rail to a maximum voltage (i.e., a maximum setting). Initiating the power supply rail to the maximum voltage can include initiating one or more power supply rails to a maximum voltage corresponding to the power supply rail. As an example, initiating the power supply rail to a maximum voltage can include initiating one or more positive power supply rails to a maximum positive voltage and/or initiating one or more negative power supply rails to a maximum negative voltage.

The maximum setting for the power supply rail can be a maximum voltage magnitude setting. As an example, the positive power supply rail 45 can be set to a maximum positive DC voltage setting for that rail. As another example, the negative power supply rail 46 can be set to a maximum negative DC voltage setting for that rail.

To initiate the power supply rail to the maximum setting, the processor 44 can determine a maximum voltage setting for the power supply rail and send to the voltage converter circuit 42 a digital communication or analog signal indicative of the maximum voltage setting. The voltage converter circuit 42 is configured to set the voltage magnitude of the power supply rail (e.g., the positive power supply rail 45 and/or the negative power supply rail 46) based on the maximum voltage setting indicated by the digital communication or analog signal. In accordance with at least some embodiments, the digital communication or analog signal can indicate the maximum voltage setting by indicating the voltage converter circuit 42 should initiate the power supply rail to a default setting (e.g., a default maximum setting).

In accordance with at least some implementations, determining the maximum voltage setting for the power supply rail can include the processor 44 reading data indicative of the maximum voltage setting within the memory 55. The processor 44 can send over the control interface 48 a digital message or analog signal indicative of the data indicative of the maximum voltage setting.

In accordance with at least some implementations, the processor 44 and/or the measurement system can further initiate (e.g., reset) a counter to count voltage samples that do not exceed a voltage threshold and/or a timer to track an amount of consecutive time since the timer was reset that sampled voltages do not exceed a voltage threshold. As an example, the voltage threshold can include a lower threshold as discussed with respect to FIG. 13 and FIG. 14. In accordance with at least some implementations, the system can set an upper threshold discussed with respect to FIG. 13 and FIG. 14 to an expected maximum input signal voltage. In accordance with at least some other implementations, the system can set the upper threshold to a value above the expected maximum input signal voltage.

Next, block 403 includes sampling an input voltage at the measurement system. As an example, sampling the input voltage can include an ADC sampling an input voltage (e.g., the ADC 47 sampling a voltage on the ADC input circuit 59). As another example, sampling the input voltage can include a processor (e.g., the processor 44) receiving an output of an ADC (e.g., the ADC 47). In one respect, the output of the ADC 47 is representative of a voltage on the ADC input circuit 59. In another respect, the output of the ADC 47 is representative of an input signal (e.g., the input signal on the positive analog input 49 and the negative analog input 50). That input signal can include a voltage or a current.

In accordance with at least some implementations, the input voltage is sampled repeatedly while the measurement system is powered on. In accordance with at least some implementations, the input voltage is sampled repeatedly while the measurement system is powered on and operating in a measurement mode. In accordance with at least some implementations, the repetitive sampling of the input voltage occurs at a rate to avoid aliasing of the input voltage by sampling the input voltage at a rate that equals or exceeds the Nyquist frequency corresponding to the input voltage.

As shown in FIG. 6, sampling the input voltage occurs after performing functions shown in block 402, the block 406, the block 407, or the block 408.

In accordance with at least some implementations including the positive power supply rail 45 and the negative power supply rail 46, a single ADC can be used to sample an input signal such that single digital message or analog signal is output to the voltage converter circuit 42 for adjusting the positive power supply rail 45 and the negative power supply rail 46. In accordance with at least some other implementations including the positive power supply rail 45 and the negative power supply rail 46, a first ADC can be used to sample an input signal such that a first digital message or analog signal is output to the voltage converter circuit 42 for adjusting the positive power supply rail 45, and a second ADC could be used to sample the input signal such that a second digital message or analog signal is output to the voltage converter circuit 42 for adjusting the negative power supply rail 46.

Next, block 404 making a determination with respect to a voltage threshold. As an example, block 404 can include determining whether the sampled input voltage is less than a voltage threshold. The processor 44 can make the determination of block 404. In accordance with at least some implementations, the processor 44 reads the voltage threshold from the memory 55. In accordance with at least some implementations, the processor 44 determines the voltage threshold and writes the voltage threshold into the memory 55.

If the processor determines the sampled input voltage is not less than the voltage threshold (i.e., the sampled input voltage is greater than the voltage threshold), then the method can continue at block 408 (discussed further below). If the processor determines the sampled input voltage is less than the voltage threshold (i.e., the sampled input voltage is not greater than the voltage threshold), then the method can continue at block 405 (discussed further below).

Additionally or alternatively, the processor 44 or the measurement system can include determining whether the sampled input voltage is greater than the voltage threshold such that the "Yes" and "No" indicators adjacent the line segments leading from block 404 can be swapped.

Next, block 405 includes applying a filter. As an example, the filter can comprise a time filter that tracks a quantity of time that sampled input voltages have been less than the voltage threshold. As another example, the filter can comprise a quantity filter that tracks a quantity of input voltage samples that have been less than the voltage threshold. In accordance with at least some implementations, a processor (e.g., the processor 44) applies the filter. In accordance with at least some of those implementations, the processor 44 can include a counter to count voltage samples or a timer to track the time. Moreover, the processor 44 can be configured to reset the counter or the timer after a change to the power supply rail(s) voltage setting has occurred.

Next, block 406 determining whether a filter threshold has been breached. For example, the processor 44 can determine whether a timer or an amount of time indicated by the timer exceeds a filter threshold indicative of an amount of time. As another example, the processor 44 can determine whether a counter or a quantity of voltage samples indicated by the counter exceeds a filter threshold indicative of a quantity of samples (e.g., a quantity of consecutive samples that do not breach a voltage threshold). If a determination at block 406 indicates the filter threshold has not been breached, then a method based on functions of the function set 400 can continue at block 407, otherwise such method can continue at block 403.

Next, block 407 includes decreasing a voltage of the power supply rail. As an example decreasing the voltage of the power supply rail can include decreasing the voltage of multiple power supply rails (e.g., positive power supply rail 45 and the negative power supply rail 46). As another example, decreasing the voltage can include decreasing the voltage magnitude of the power supply rail. In accordance with at least some implementations, the processor 44 determines a new voltage setting for a power supply rail and sends to the voltage converter circuit 42 a digital communication or analog signal indicative of the new voltage setting. The voltage converter circuit 42 is configured to decrease the voltage magnitudes of the positive power supply rail 45 and the negative power supply rail 46 based on the new voltage setting indicated by the digital communication or analog signal.

In accordance with at least some implementations, determining the new voltage setting for the positive power supply rail 45 can include subtracting a voltage step value from an existing voltage setting of the positive power supply rail 45. In accordance with at least some implementations, determining the new voltage setting for the negative power supply rail 46 can include adding a voltage step value from an existing voltage setting of the negative power supply rail 46.

For purposes of this description decreasing the voltages of the positive power supply rail 45 and the negative power supply rail 46 includes decreasing a magnitude of the voltage of the positive power supply rail 45 and the negative power supply rail 46, respectively. On the other hand, increasing the voltages of the positive power supply rail 45 and the negative power supply rail 46 includes increasing a magnitude of the voltage of the positive power supply rail 45 and the negative power supply rail 46, respectively.

Next, block 408 includes setting the power supply rail to a maximum voltage. As an example setting the power supply rail to the maximum voltage can include setting multiple power supply rails (e.g., positive power supply rail 45 and the negative power supply rail 46) to the maximum voltage. For a positive power supply rail, the maximum voltage is a maximum magnitude of a positive voltage for the measurement device. For a negative power supply rail, the maximum voltage is a maximum magnitude of a negative voltage for the measurement device.

As discussed above, the functions of block 408 can be performed if the determination at block 404 indicates the sampled input voltage is not less than the voltage threshold.

To set the power supply rail to the maximum setting, the processor 44 can determine the maximum voltage setting for the power supply rail and send to the voltage converter circuit 42 a digital communication or analog signal indicative of the maximum voltage setting. The voltage converter circuit 42 is configured to set the voltage magnitude of the power supply rail (e.g., the positive power supply rail 45 and/or the negative power supply rail 46) based on the maximum voltage setting indicated by the digital communication or analog signal. In accordance with at least some embodiments, the digital communication or analog signal can indicate the maximum voltage setting by indicating the voltage converter circuit 42 should initiate the power supply rail to a default setting (e.g., a default maximum setting).

In accordance with at least some implementations, after making the determination at block 404 and/or after setting the power supply rail to the maximum voltage at block 408, the system can further initiate (e.g., reset) a counter to count voltage samples that do not exceed a voltage threshold and/or a timer to track an amount of consecutive time since the timer was reset that sampled voltages do not exceed a voltage threshold. As an example, the voltage threshold can include a lower threshold as discussed with respect to FIG. 13 and FIG. 14. In accordance with at least some implementations, the system can set an upper threshold discussed with respect to FIG. 13 and FIG. 14 to an expected maximum input signal voltage. In accordance with at least some other implementations, the system can set the upper threshold to a value above the expected maximum input signal voltage.

2. Second Function Set

Next, FIG. 7 is a flow chart showing a function set 500 (e.g., a set of function(s)) of a method in accordance with the example implementations. The functions of the function set 500 are shown in a block 501, 502, 503, 504, 505. Two or more functions and/or portions of two or more functions of the function set 500 can be performed at the same time. In accordance with at least some embodiments, a method including a function of the function set 500 can be performed, at least in part, by one or more of the measurement system 10, the electrical network 40, or the processor 44.

Block 501 includes adjusting a power supply rail for one or more circuit components to a first setting. As an example, the power supply rail can include the positive power supply rail 45 or the negative power supply rail 46, and the one or more circuit components can include one or more components of the electrical circuitry 51. As noted, adjusting the power supply rail can include adjusting multiple power supply rails. Accordingly, the multiple power supply rails can include the positive power supply rail 45 and the negative power supply rail 46, and the one or more circuit components can include one or more components of the electrical circuitry 51.

With regard to the first setting, as an example, the first setting can include a default, maximum voltage setting for the power supply rail. As another example, the first setting can include a voltage setting below the default, maximum voltage setting. Upon powering up the measurement system 10, the power supply rail can be adjusted to the default, maximum voltage setting.

Next, block 502 includes determining one or more voltage samples by sampling an input voltage corresponding to an input signal. As an example, the ADC 47 can sample an input voltage on the ADC input circuit 59 and output a digital signal representative of the voltage sample(s). The processor 44 can determine the voltage sample(s) by converting the digital signal to data indicative of the voltage samples. The voltage sample(s) can be stored in the voltage sample 114. In accordance with at least some implementations, the voltage sample 114 includes a single voltage sample that is the most-recent voltage sample.

As an example, the input signal can include an input signal at the positive analog input 49 and the negative analog input 50. The input signal can be single-ended or differential. The input signal can include a direct current input signal or an alternating current input signal. The processor 44 can determine whether the input signal is a direct or alternating current input signal based on the zero crossing counter 112 and the zero crossing timer 113. The processor 44 can determine the input signal is an alternating current input signal offset by a direct current voltage.

In accordance with at least some implementations, the quantity of the one or more voltage samples can equal a threshold amount of samples counted for comparison to a counter or an amount of samples captured during a threshold amount of time. The processor can repeat determining one or more voltage samples while the measurement system 10 is powered on. In accordance with at least some embodiments, the processor 44 can begin write over existing voltage samples within the voltage sample 114 after adjusting the power supply rail to a different setting.

Figure 13:
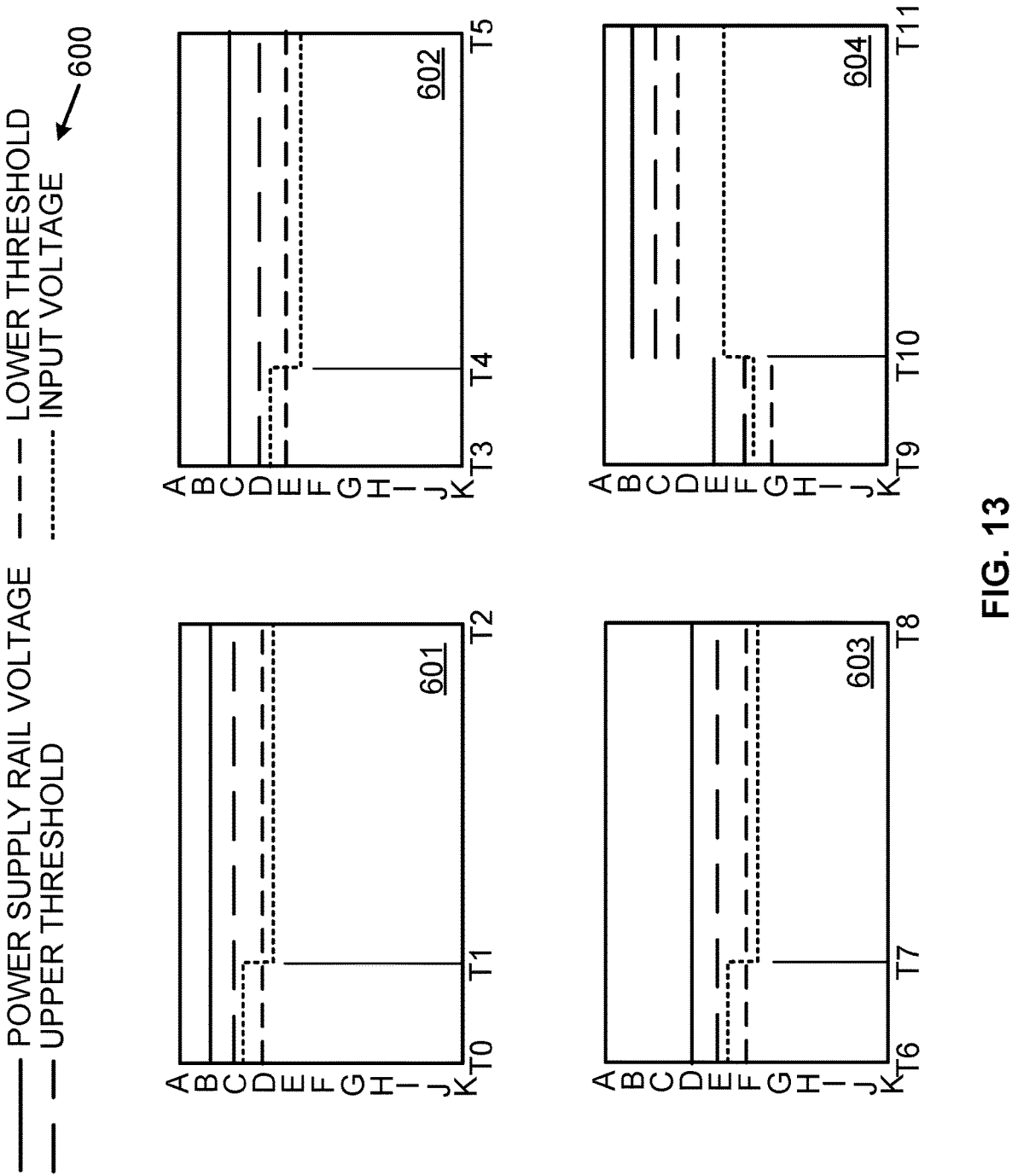
FIG. 13 and FIG. 14 show power supply rail adjustments, in accordance with the example implementations.
Figure 14:
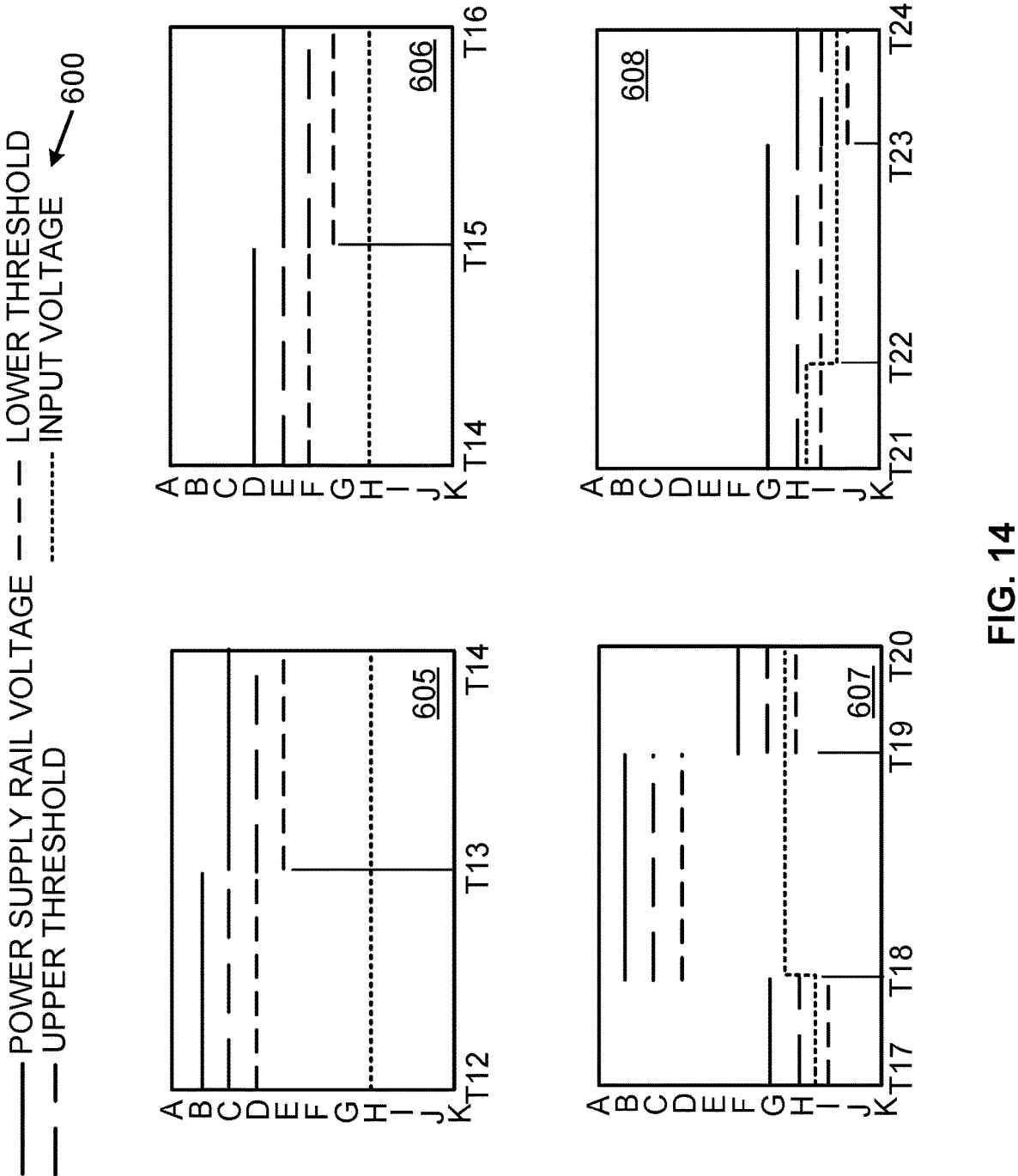

Next, block 503 includes determining whether the one or more voltage samples breach a first voltage threshold or a second voltage threshold. As an example, the processor 44 can compare the one or more voltage samples to the existing upper threshold 105 and/or the existing lower threshold 106. FIG. 13 and FIG. 14 show examples of input voltage samples being compared to an upper threshold and a lower threshold.

Next, block 504 includes adjusting the power supply rail to a second setting if a predetermined quantity of the one or more voltage samples breach the first voltage threshold. A magnitude of the second setting equals or is greater than a magnitude of the first setting.

Next, block 505 includes adjusting the power supply rail to a third setting if the one or more voltage samples are captured during at least a threshold amount of time and do not breach the second voltage threshold. The magnitude of the first setting is greater than a magnitude of the third setting.

In accordance with at least some of the implementations, such as implementations that provide a method based on the function set 500, a value of the first voltage threshold is identical to a value of the second voltage threshold. In accordance with at least some other implementations providing a method based on the function set 500, the values of the first and second voltage thresholds are different. As an example, the first voltage threshold can be the upper threshold shown in FIG. 13 and FIG. 14 and the second voltage threshold can be the lower threshold shown in FIG. 13 and FIG. 14. As another example, the first voltage threshold can be the existing upper threshold 105 shown in FIG. 5 and the second voltage threshold can be the existing lower threshold 106 shown in FIG. 5.

In accordance with at least some of the implementations, such as implementations that provide a method based on the function set 500, the one or more circuit components comprise one or more analog components. For instance, the one or more analog circuit components include a buffer amplifier and a differential amplifier. Additionally or alternatively, the one or more analog circuit components can include one or more from among: an operational amplifier, an analog buffer, a filter, a comparator, an analog switch, or circuitry built with discrete parts like transistors and/or diodes. As another example, the one or more circuit components comprise one or more digital components, such as an embedded microprocessor.

In accordance with at least some of the implementations, such as implementations that provide a method based on the function set 500, the input signal is an input to a measurement device. Moreover, each voltage sample of the one or more voltage samples corresponds to an amplitude of a respective portion of the input signal, and the first setting is a maximum magnitude voltage setting required for a maximum expected amplitude of any input signal to a measurement device. As an example, the maximum magnitude voltage setting can include and/or be represented by the maximum rail voltage 101.

In accordance with at least some implementations, such as the implementations discussed in the preceding paragraph, adjusting the power supply rail for the one or more circuit components to the first setting occurs in response to a power-on event and/or pressing of a button. As an example, the button includes an on/off button or an amplifier gain button. Other examples of the button are also possible.

In accordance with at least some implementations, such as implementations that provide a method based on the function set 500, the input signal is an input to a measurement device. Moreover, each voltage sample of the one or more voltage samples corresponds to an amplitude of a respective portion of the input signal, and the first setting includes a voltage setting less than a maximum magnitude voltage setting required for a maximum expected amplitude of any input signal to a measurement device.

In accordance with at least some implementations, such as implementations that provide a method based on the function set 500, the power supply rail includes a negative power supply rail (e.g., the negative power supply rail 46) or a positive power supply rail (e.g., the positive power supply rail 45).

In accordance with at least some implementations, such as implementations that provide a method based on the function set 500, the power supply rail comprises a first power supply rail. Moreover, the method comprises adjusting a second power supply rail for the one or more circuit components to a fourth setting. Further, the method includes adjusting the second power supply rail to a fifth setting if a predetermined quantity of the one or more voltage samples breach the first voltage threshold. Furthermore, the method includes adjusting the second power supply rail to a sixth setting if the one or more voltage samples are captured during at least the threshold amount of time and do not breach the second voltage threshold. A magnitude of the fourth setting is greater than a magnitude of the sixth setting.

In accordance with at least some implementations, such as the implementations discussed in the preceding paragraph, (i) the first power supply rail includes a positive power supply rail and the second power supply rail includes a negative power supply rail, or (ii) the first power supply rail includes a first positive power supply rail and the second power supply rail includes a second positive power supply rail, or the first power supply rail includes a first negative power supply rail and the second power supply rail includes a second negative power supply rail.

In accordance with at least some implementations, such as the implementations discussed in the two preceding paragraphs, a processor determines whether the one or more voltage samples breach the first voltage threshold or the second voltage threshold, and the processor uses one or more digital-to-analog converters (e.g., the digital-to-analog converter 61 shown in FIG. 4) to output one or more analog control signals to adjust the first power supply rail to the second setting or the third setting, and to adjust the second power supply rail to the fifth setting or the sixth setting.

In accordance with at least some implementations, such as implementations that provide a method based on the function set 500, a processor determines whether the one or more voltage samples breach the first voltage threshold or the second voltage threshold. A logic device includes or controls a voltage converter circuit. Adjusting the power supply rail to the first setting includes the processor sending to the logic device a first digital control signal. Adjusting the power supply rail to a second setting includes the processor sending to the logic device a second digital control signal. Adjusting the power supply rail to a third setting includes the processor sending to the logic device a third digital control signal. As an example, the logic device includes one or more from among an application specific integrated circuit (ASIC), a power supply integrated circuit (PSIC), a power management integrated circuit (PMIC), a processor, or a state machine with a shift register.

In accordance with the implementations discussed in the preceding paragraph, the first digital control signal, the second digital control signal, or the third digital control signal is communicated using an inter-integrated circuit protocol, a serial peripheral interface protocol, or by pulse code modulation.

In accordance with the implementations discussed in the two preceding paragraphs, the voltage converter circuit includes a linear power supply or a switch-mode power supply. In at least some implementations, the switch-mode power supply includes an isolated converter that isolates input and output circuitry. As an example, the isolated converter can include a flyback converter or a forward converter. In at least some implementations, the switch-mode power supply includes a non-isolated converter that uses a common current path for an input source and an output load. As an example, the non-isolated converter can include a buck converter, a boost converter, or a buck-boost converter.

In accordance with at least some implementations, such as implementations that provide a method based on the function set 500, a processor determines whether the one or more voltage samples breach the first voltage threshold or the second voltage threshold, and the processor uses a digital-to-analog converter (e.g., the digital-to-analog converter 61 shown in FIG. 4) to output an analog control signal at a first level if adjusting the power supply rail to the second setting or to a second level if adjusting the power supply rail to the third setting.

In accordance with at least some implementations, such as implementations that provide a method based on the function set 500, the first setting equals a sum of the first voltage threshold and a fixed offset voltage.

In accordance with at least some implementations, such as implementations that provide a method based on the function set 500, the predetermined quantity of the one or more voltage samples equals one.

In accordance with at least some implementations, such as implementations that provide a method based on the function set 500, the predetermined quantity of the one or more voltage samples equals a predetermined quantity of multiple consecutive voltage samples. As an example, if the predetermined quantity of multiple consecutive voltage samples equals five hundred samples and a number of consecutive samples up to four-hundred ninety-nine consecutive samples did not breach the first voltage threshold, but the five hundredth or an earlier sample breached the first voltage threshold, then the processor 44 can reset the existing counter value to zero and begin counting consecutive samples that breach the first or second voltage threshold, or that do not breach either of the first or second voltage threshold.

In accordance with at least some implementations, such as implementations that provide a method based on the function set 500, the predetermined quantity of the one or more voltage samples equals two or more voltage samples during the threshold amount of time.

In accordance with at least some implementations, such as implementations that provide a method based on the function set 500, a particular voltage sample of the one or more voltage samples breaches the first voltage threshold (e.g. the existing upper threshold 105), and the second setting equals a sum of the particular voltage sample and a fixed offset voltage (e.g., the voltage step 107).

3. Third Function Set

Next, FIG. 8 shows a function set 510 (e.g., a set of function(s)) of a method in accordance with the example implementations. The functions of the function set 510 are shown in a block 511. A method of the example implementations can include a method that includes one or more functions of the function set 500 shown in FIG. 7 and one or more functions of the function set 510.

Block 511 includes generating the input voltage by dividing an input signal one or more times via a voltage divider network connected to the one or more circuit components. The electrical circuitry 51 can include one or more voltage dividers to divide the input signal. The electrical circuitry 51 can include electrical circuits to connect to the positive analog input 49 and the negative analog input 50. The electrical circuitry 51 can include electrical circuits to connect to the ADC 47. For example, the electrical circuitry 51 can include the ADC input circuit 59 or an electrical circuit connected to the ADC input circuit 59. The electrical circuitry 51 can include electrical circuitry for connecting to the measurement device 60.

4. Fourth Function Set

Next, FIG. 9 is a flow chart showing a function set 515 (e.g., a set of function(s)) of a method in accordance with the example implementations. The functions of the function set 515 are shown in a block 516, 517, 518. Two or more functions and/or portions of two or more functions of the function set 515 can be performed at the same time. A method of the example implementations can include a method that includes one or more functions of the function set 500 shown in FIG. 7 and one or more functions of the function set 515.

Block 516 includes adjusting a second power supply rail for the one or more circuitry components to a fourth setting. As an example, if the power supply rail adjusted with respect to block 501 above is the positive power supply rail 45, then the second power supply rail can include the negative power supply rail 46 or another positive power supply rail. As another example, if the power supply rail adjusted with respect to block 501 above is the negative power supply rail 46, then the second power supply rail can include the positive power supply rail 45 or another negative power supply rail.

With regard to the fourth setting, as an example, the fourth setting can include a default, maximum voltage setting for the second power supply rail. As another example, the fourth setting can include a voltage setting below the default, maximum voltage setting for the second power supply rail. Upon powering up the measurement system 10, the second power supply rail can be adjusted to the default, maximum voltage setting for the second power supply rail. In accordance with at least some embodiments, a magnitude of the first setting discussed above with respect to block 501 can equal the magnitude of the fourth setting.

Next, block 517 includes adjusting the second power supply rail to a fifth setting if a predetermined quantity of the one or more voltage samples breach the first voltage threshold. As noted above, the first voltage threshold can include the existing upper threshold 105.

Next, block 518 includes adjusting the second power supply rail to a sixth setting if the one or more voltage samples are captured during at least the threshold amount of time and do not breach the second voltage threshold. A magnitude of the fourth setting is greater than a magnitude of the sixth setting. As noted above, the second voltage threshold can include the existing lower threshold 106.

In accordance with at least some embodiments, a magnitude of the second setting discussed above with respect to block 504 can equal the magnitude of the fifth setting, and/or a magnitude of the third setting discussed above with respect to block 505 can equal the magnitude of the sixth setting.

Adjusting the second power supply rail to the fourth, fifth, or sixth setting can include the processor 44 sending a digital control signal indicative of the fourth, fifth, or sixth setting, respectively, to the voltage converter circuit 42. As an example, that digital control signal can be communicated using an inter-integrated circuit protocol, a serial peripheral interface protocol, or by pulse code modulation.

In accordance with at least some implementations with a positive power supply rail and a negative power supply rail, the measurement system 10 and/or the electrical network 40 can be configured to determine if a threshold quantity of consecutive input voltage samples and/or a quantity of consecutive input voltage samples over a threshold quantity of time have been positive and to set the negative power supply rail close to zero volts (e.g., −1.0 volts) even though the positive power supply rail is set to a voltage setting further away from zero volts (e.g., 7.0 volts).

5. Fifth Function Set

Next, FIG. 10 shows a function set 520 (e.g., a set of function(s)) of a method in accordance with the example implementations. The functions of the function set 520 are shown in a block 521. A method of the example implementations can include a method that includes one or more functions of the function set 500 shown in FIG. 7 and one or more functions of the function set 520.

Block 521 includes determining a frequency of the input signal. One or more of the first setting, the second setting, or the third setting is based on whether the frequency indicates the input signal is alternating.

As an example, the processor 44 can determine the frequency in part by detecting how many times the input signal crosses a 0.0 voltage level during an amount of time indicated by the zero crossing timer 113. The examples discussed above with respect to the zero crossing counter 112 and the zero crossing timer 113 are applicable to block 521.

6. Sixth Function Set

Next, FIG. 11 is a flow chart showing a function set 525 (e.g., a set of function(s)) of a method in accordance with the example implementations. This method can be performed if the predetermined quantity of the one or more voltage samples equals two or more voltage samples during the threshold amount of time. The functions of the function set 525 are shown in a block 526, 527, 528, 529. Two or more functions and/or portions of two or more functions of the function set 525 can be performed at the same time. A method of the example implementations can include a method that includes one or more functions of the function set 500 shown in FIG. 7 and one or more functions of the function set 525.

The method including the functions of the function set 525 can be performed if the predetermined quantity of the one or more voltage samples breach the first voltage threshold, as discussed with respect to block 504 above.

Block 526 includes adjusting the second voltage threshold to establish a modified second voltage threshold. As an example, adjusting the second voltage threshold can include adjusting the existing lower threshold 106. As an example, adjusting the second voltage threshold can include decreasing the second voltage threshold (e.g., the existing lower threshold 106 by the voltage step 107. As another example, adjusting the second voltage threshold can include setting the second voltage threshold to a value equal to the voltage of a recent voltage sample minus the voltage step 107.

Next, block 527 includes determining one or more further voltage samples by further sampling the input voltage corresponding to the input signal. The aspects regarding determining one or more voltage samples for block 502 above are applicable to determining one or more voltage samples for block 527.

Next, block 528 includes determining whether the one or more further voltage samples breach the modified second voltage threshold. As an example, the processor 44 can compare the one or more further voltage samples to the existing lower threshold 106 (equal to the modified second voltage threshold). FIG. 13 and FIG. 14 show examples of input voltage samples being compared to an upper threshold and a lower threshold.

Next, block 529 includes adjusting the power supply rail to a fourth setting if the one or more further voltage samples are captured during at least the threshold amount of time do not breach the modified second voltage threshold. The magnitude of the fourth setting is less than a magnitude of the second setting. As an example, a graph 608 in FIG. 14 shows the input voltage is below the lower threshold from time T22 to time T24. The graph 608 also shows the lower threshold is adjusted at time T23 from a voltage I to a voltage J (which is less than voltage I).

7. Seventh Function Set

Next, FIG. 12 is a flow chart showing a function set 530 (e.g., a set of function(s)) of a method in accordance with the example implementations. This method can be performed if the one or more voltage samples are captured during at least the threshold amount of time and do not breach the second voltage threshold. The functions of the function set 530 are shown in a block 531, 532, 533, 534, 535, 536. Two or more functions and/or portions of two or more functions of the function set 530 can be performed at the same time. A method of the example implementations can include a method that includes one or more functions of the function set 500 shown in FIG. 7 and one or more functions of the function set 530.

The method including the functions of the function set 530 can be performed if the one or more voltage samples are captured during at least the threshold amount of time and do not breach the second voltage threshold, as discussed with respect to block 505 above.

Block 531 includes adjusting the first voltage threshold to establish a modified first voltage threshold. As an example, adjusting the first voltage threshold can include adjusting the existing upper threshold 105. As an example, adjusting the first voltage threshold can include decreasing the first voltage threshold (e.g., the existing upper threshold 105 by the voltage step 107. As another example, adjusting the first voltage threshold can include setting the first voltage threshold to a value equal to the voltage of a recent voltage sample plus the voltage step 107.

Next, block 532 includes adjusting the second voltage threshold to establish a modified second voltage threshold. As an example, adjusting the second voltage threshold can include adjusting the existing lower threshold 106. As an example, adjusting the second voltage threshold can include decreasing the second voltage threshold (e.g., the existing lower threshold 106 by the voltage step 107. As another example, adjusting the second voltage threshold can include setting the second voltage threshold to a value equal to the voltage of a recent voltage sample minus the voltage step 107.

Next, block 533 includes determining one or more further voltage samples by further sampling the input voltage corresponding to the input signal. The aspects regarding determining one or more voltage samples for block 502 above are applicable to determining one or more voltage samples for block 533.

Next, block 534 includes determining whether the one or more further voltage samples breach the modified first voltage threshold or the modified second voltage threshold. As an example, the processor 44 can compare the one or more voltage samples to the existing upper threshold 105 (equal to the modified first voltage threshold) and/or the existing lower threshold 106 (equal to the modified second voltage threshold). FIG. 13 and FIG. 14 show examples of input voltage samples being compared to an upper threshold and a lower threshold.

Next, block 535 includes adjusting power supply rail to the second setting if a predetermined quantity of the one or more further voltage samples breach the modified first voltage threshold. As an example, the second setting can include equal the maximum rail voltage 101.

Next, block 536 includes adjusting the power supply rail to a fourth setting if the one or more further voltage samples are captured during at least the threshold amount of time and do not breach the modified second voltage threshold. The magnitude of the fourth setting is less than a magnitude of the second setting. The magnitude of the fourth setting is less than a magnitude of the third setting discussed in block 505 above.

V. Example Power Supply Rail Adjustments

Next, FIG. 13 and FIG. 14 show power supply rail adjustments in accordance with the example embodiments. First, FIG. 13 and FIG. 14 show a legend 600 corresponding to the example power supply rail adjustments. The legend shows line segments corresponding to a rail voltage, an upper threshold, a lower threshold, and an input voltage. Second, FIG. 13 shows a graph 601, 602, 603, 604 and FIG. 14 shows a graph 605, 606, 607, 608. All of those graphs include line segments represented in the legend 600. As an example, the power supply rail voltage represented in those graphs can represent a voltage on the positive power supply rail 45 shown in FIG. 2.

Each of the graphs shown in FIG. 13 and FIG. 14 is adjacent to letters A to K representing different voltage levels. As an example, the letter K can represent 0.0 volts and each successive letter above the letter K can increase by a given voltage amount, such as 0.3 volts, 0.5 volts, or 1.0 volts, such that the graphs represent a voltage range of 0.0 to 3.0 volts, 0.0 to 5.0 volts, or 0.0 to 10.0 volts, respectively. The graphs in FIG. 13 and FIG. 14 can represent time and/or quantities of voltage samples horizontally. A time represented by the letter "T" followed by a number corresponds to the vertical line above the time.

As shown in the graph 601, the power supply rail voltage is set to voltage B, the upper threshold is set to voltage C, and the lower threshold is set to voltage D. Between time T0 and time T1, the input voltage is at a level between voltage C and voltage D. Between time T1 and T2, the input voltage is at a level between voltage D and voltage E. As an example, the voltage C can be a maximum, default maximum level for a power supply rail, such as the positive power supply rail 45. As another example, the voltage C can be a voltage level below a maximum, default maximum level for a power supply rail, such as the positive power supply rail 45.

In accordance with at least some implementations, a maximum value of the input voltage can occur only when the power supply rail is set to a maximum voltage, and the upper threshold is always set above the voltage of the input voltage. In accordance with at least some of those implementations, the system may not set an upper threshold in connection with setting the power supply rail voltage to the maximum voltage because the input voltage cannot exceed a threshold above the input voltage.

As shown in the graph 602, the power supply rail voltage is set to voltage C, the upper threshold is set to voltage D, and the lower threshold is set to voltage E. Between time T3 and T4, the input voltage is at a level between voltage D and voltage E. Between time T4 and time T5, the input voltage is at a level between voltage E and voltage F. In accordance with implementations in which time T3 comes after time T2 in the graph 601, at a time between time T2 and time T3, a system, such as the measurement system 10 or an electrical network, such as the electrical network 40, can adjust the power supply rail voltage from voltage B to voltage C, the upper threshold from voltage C to voltage D, and the lower threshold from voltage D to voltage E. A time at which those adjustments are made can include a time at which (or following a time at which) the input voltage has remained below the voltage D for a threshold amount of time and/or a time at which a threshold number of consecutive voltage samples have been below the voltage D.

As shown in the graph 603, the power supply rail voltage is set to voltage D, the upper threshold is set to voltage E, and the lower threshold is set to voltage F. Between a time T6 and time T7, the input voltage is at a level between voltage E and voltage F. Between time T7 and T8, the input voltage is at a level between voltage F and voltage G. In accordance with implementations in which time T6 comes after time T5 in the graph 602, at a time between time T5 and time T6, a system, such as the measurement system 10, or an electrical network, such as the electrical network 40, can adjust the power supply rail voltage from voltage C to voltage D, the upper threshold from voltage D to voltage D, and the lower threshold from voltage D to voltage E. A time at which those adjustments are made can include a time at which (or following a time at which) the input voltage has remained below the voltage E for a threshold amount of time and/or a time at which a threshold number of consecutive voltage samples have been below the voltage E.

As shown in the graph 604, between time T9 and time T10, the power supply rail voltage is set to voltage E, the upper threshold is set to voltage F, and the lower threshold is set to voltage G. Between time T9 and just before time T10, the input voltage is at a level between voltage F and voltage G. At time T10, the input voltage increases above the upper threshold set to voltage F. As a result, the system adjusts the power supply rail voltage to voltage B, the upper threshold to voltage C, and the lower threshold to voltage D. Between time T10 and T11, the input voltage is at a level between voltage E and voltage F.

Turning to FIG. 14, the graph 605 and the graph 606 represent a sequence of adjustments where each adjustment of the power supply rail, upper threshold, and lower threshold in the sequence is by equal amounts. In the graph 605, between time T12 and time T13, the power supply rail is set to voltage B, the upper threshold is set to voltage C, and the lower threshold is set to D, and between time T13 and time T14, the power supply rail is set to voltage C, the upper threshold is set to voltage D, and the lower threshold is set to E. Time T13 can be a time at which the measurement system 10 or the electrical network 40 determines the input voltage has been below the lower threshold (i.e., voltage D) for a threshold amount of time or after a threshold amount of consecutive samples have been below the lower threshold. Time T14 is represented in the graph 605 and the graph 606. Time T14 can be a time at which the measurement system 10 or the electrical network 40 determines the input voltage has been below the lower threshold (i.e., voltage E) for a threshold amount of time or after a threshold amount of consecutive samples have been below the lower threshold.

In the graph 606, between time T14 and time T15, the power supply rail is set to voltage D, the upper threshold is set to voltage E, and the lower threshold is set to F, and between time T15 and time T16, the power supply rail is set to voltage E, the upper threshold is set to voltage F, and the lower threshold is set to G. Time T15 can be a time at which the measurement system 10 or the electrical network 40 determines the input voltage has been below the lower threshold (i.e., voltage F) for a threshold amount of time or after a threshold amount of consecutive samples have been below the lower threshold.

In accordance with at least some embodiments, the measurement system 10 or the electrical network 40 determines and sets the upper threshold and the lower threshold in response to setting the power supply rail to the voltage(s) shown in each graph. As an example, the measurement system 10 or the electrical network 40 can set the upper threshold to a voltage equal to the voltage of the power supply rail minus a first fixed offset voltage and can set the lower threshold to a voltage equal to the voltage of the power supply rail minus a second fixed offset voltage greater than the first fixed offset voltage. As another example, the measurement system 10 or the electrical network 40 can set the upper threshold to a voltage equal to the voltage of the power supply rail minus a fixed offset voltage and can set the lower threshold to a voltage equal to the voltage of the upper threshold (after being adjusted by the fixed offset voltage) minus the fixed offset voltage.

Next, the graph 607 shows an alternative way in which the power supply rail is adjusted. In the graph 607, between time T17 and time T18, the power supply rail is set to voltage G, the upper threshold is set to voltage H, and the lower threshold is set to I. At time T17, the input voltage increases above the upper threshold set to voltage H. As a result, the system adjusts the power supply rail voltage to voltage B, the upper threshold to voltage C, and the lower threshold to voltage D. Between time T18 and T19, the input voltage is at a level between voltage G and voltage H, and is below the lower threshold. Time T19 can be a time at which the measurement system 10 or the electrical network 40 determines the input voltage has been below the lower threshold (i.e., voltage D) for a threshold amount of time or after a threshold amount of consecutive samples have been below the lower threshold. Unlike the examples adjustments represented in the graph 605 and the graph 606, at time T19, the system adjusts the upper threshold to a voltage above the input voltage, the lower threshold to a voltage below the input voltage, and the power supply rail to a value above the upper threshold (e.g., a voltage value equal to the upper threshold plus a fixed offset voltage).

As shown in the graph 608, between a time T21 and time T23, the power supply rail voltage is set to voltage G, the upper threshold is set to voltage H, and the lower threshold is set to voltage I. At time T22, the input voltage decreases below the lower threshold. A time period from T22 to T23 can represent an amount of time that the input voltage is below the lower threshold or during which a threshold quantity of consecutive samples of the input voltage are below the lower threshold. As a result, at time T23, the system adjusts the power supply rail voltage to voltage H, the upper threshold to voltage I, and the lower threshold to voltage J. Between time T23 and T24, the input voltage is at a level between voltage I and voltage J.

VI. Example Vehicle

The description above refers to a vehicle and a CAN bus within a vehicle. A vehicle is a mobile machine that can be used to transport a person, people, and/or cargo. A vehicle can be driven and/or otherwise guided along a path (e.g., a paved road or otherwise) on land, in water, in the air, and/or outer space. A vehicle can be wheeled, tracked, railed, and/or skied. A vehicle can include an automobile, a motorcycle (e.g., a two or three wheel motorcycle), an all-terrain vehicle (ATV) defined by ANSI/SVIA-1-2007, a snowmobile, a watercraft (e.g., a JET SKI® watercraft), a light-duty truck, a medium-duty truck, a heavy-duty truck, a semi-tractor, a drone, and/or a farm machine. A vehicle can include and/or use any appropriate voltage and/or current source, such as a battery, an alternator, a fuel cell, and the like, providing any appropriate current and/or voltage, such as about 12 volts, about 42 volts, 400 volts, 800 volts, or some other voltage level. A vehicle can include and/or use any system and/or engine to provide its mobility. Those systems and/or engines can include vehicle components that use fossil fuels, such as gasoline, diesel fuel, natural gas, propane, and the like, electricity, such as that generated by a battery, magneto, fuel cell, solar cell and the like, wind and hybrids and/or combinations thereof. A vehicle can be operable to operate as an autonomous vehicle.

A vehicle bus can include one or more conductors (e.g., copper wire conductors) and/or can be wireless. As an example, a vehicle bus can include one or two conductors for carrying vehicle data messages in accordance with a vehicle data message (VDM) protocol, such as a bi-directional VDM protocol. A bi-directional VDM protocol can include a SAE® J1850 (PWM or VPW) VDM protocol, an SAE® J1939 VDM protocol based on the SAE® J1939_201808 serial control and communications heavy duty vehicle network-top level document, and/or any other core J1939 standard, an ISO® 15764-4 controller area network (CAN) VDM protocol, an ISO® 9141-2 K-Line VDM protocol, an ISO® 14230-4 KWP2000 K-Line VDM protocol, an ISO® 17458 (e.g., parts 1-5) FlexRay VDM protocol, an ISO® 17987 local interconnect network (LIN) VDM protocol, a CAN 2.0 VDM protocol, standardized in part using an ISO® 11898-1:2015 road vehicle—CAN—Part I: data link layer and physical signaling protocol, a CAN FD VDM protocol (e.g., CAN with flexible data rate VDM protocol), a MOST® Cooperation VDM protocol (such as the MOST Specification Rev. 3.0 E2, or the MOST® Dynamic Specification, Rev. 3.0.2), an Ethernet VDM protocol (e.g., an Ethernet 802.3 protocol using a BROADR-REACH® physical layer transceiver specification for Automotive Applications by Broadcom Inc., San Jose, California), or some other VDM protocol defined for performing communications with or within a vehicle. The aforementioned protocols can include definition for at least physical and data link layers of the seven layer Open Systems Interconnection (OSI) model.

VII. Conclusion

It should be understood that the arrangements described herein and/or shown in the drawings are for purposes of example only and are not intended to be limiting. As such, those skilled in the art will appreciate that other arrangements and elements (e.g., machines, interfaces, functions, orders, and/or groupings of functions) can be used instead, and some elements can be omitted altogether. Furthermore, various functions described and/or shown in the drawings as being performed by one or more elements can be carried out by a processor executing computer-readable program instructions or by a combination of hardware, firmware, and/or software. For purposes of this description, execution of CRPI contained in a computer-readable memory to perform some function can include executing all of the program instructions of those CRPI or only a portion of those CRPI.

While various aspects and implementations are described herein, other aspects and implementations will be apparent to those skilled in the art. The various aspects and implementations disclosed herein are for purposes of illustration and are not intended to be limiting, with the true scope being indicated by the claims, along with the full scope of equivalents to which such claims are entitled. It is also to be understood that the terminology used herein for the purpose of describing implementations only, and is not intended to be limiting.

In this description, the articles "a," "an," and "the" are used to introduce elements and/or functions of the example implementations. The intent of using those articles is that there is one or more of the introduced elements and/or functions.

In this description, the intent of using the term "and/or" within a list of at least two elements or functions and the intent of using the terms "at least one of," "at least one of the following," "one or more of," "one or more from among," and "one or more of the following" immediately preceding a list of at least two components or functions is to cover each implementation including a listed component or function independently and each implementation including a combination of the listed components or functions. For example, an implementation described as including A, B, and/or C, or at least one of A, B, and C, or at least one of: A, B, and C, or at least one of A, B, or C, or at least one of: A, B, or C, or one or more of A, B, and C, or one or more of: A, B, and C, or one or more of A, B, or C, or one or more of: A, B, or C is intended to cover each of the following possible implementations: (i) an implementation including A, but not B and not C, (ii) an implementation including B, but not A and not C, (iii) an implementation including C, but not A and not B, (iv) an implementation including A and B, but not C, (v) an implementation including A and C, but not B, (v) an implementation including B and C, but not A, and/or (vi) an implementation including A, B, and C. For the implementations including component or function A, the implementations can include one A or multiple A. For the implementations including component or function B, the implementations can include one B or multiple B. For the implementations including component or function C, the implementations can include one C or multiple C. In accordance with the aforementioned example and at least some of the example implementations, "A" can represent a component, "B" can represent a system, and "C" can represent a symptom.

The use of ordinal numbers such as "first," "second," "third" and so on is to distinguish respective elements rather than to denote an order of those elements unless the context of using those terms explicitly indicates otherwise. The use of the symbol "$" as prefix to a number indicates the number is a hexadecimal number.

Implementations of the present disclosure can thus relate to one of the enumerated example embodiments (EEEs) listed below.

EEE 1 is a method comprising: adjusting a power supply rail for one or more circuit components to a first setting; determining one or more voltage samples by sampling an input voltage corresponding to an input signal; determining whether the one or more voltage samples breach a first voltage threshold or a second voltage threshold; adjusting the power supply rail to a second setting if a predetermined quantity of the one or more voltage samples breach the first voltage threshold, wherein a magnitude of the second setting equals or is greater than a magnitude of the first setting; and adjusting the power supply rail to a third setting if the one or more voltage samples are captured during at least a threshold amount of time and do not breach the second voltage threshold, wherein the magnitude of the first setting is greater than a magnitude of the third setting.

EEE 2 is the method of EEE 1, wherein a value of the first voltage threshold is identical to a value of the second voltage threshold.

EEE 3 is the method of any one of EEE 1-2, wherein the one or more circuit components comprise one or more analog circuit components.

EEE 4 is the method of EEE 3, wherein the one or more analog circuit components include a buffer amplifier and a differential amplifier.

EEE 5 is the method of any one of EEE 1-4, wherein the one or more circuit components comprise one or more digital components.

EEE 6 is the method of any one of EEE 1-5, wherein the input signal is an input to a measurement device, wherein each voltage sample of the one or more voltage samples corresponds to an amplitude of a respective portion of the input signal, and wherein the first setting is a maximum magnitude voltage setting required for an amplitude of a maximum input signal specified to be input to the measurement device.

EEE 7 is the method of EEE 6, wherein adjusting the power supply rail for the one or more circuit components to the first setting occurs in response to a power-on event and/or pressing of a button.

EEE 8 is the method of EEE 7, wherein the button includes an on/off button or an amplifier gain button.

EEE 9 is the method of any one of EEE 1-5, wherein the input signal is an input to a measurement device, wherein each voltage sample of the one or more voltage samples corresponds to an amplitude of a respective portion of the input signal, and wherein the first setting includes a voltage setting less than a maximum magnitude voltage setting required for an amplitude of a maximum input signal specified to be input to the measurement device.

EEE 10 is the method of any one of EEE 1-9, further comprising: generating the input voltage by dividing the input signal one or more times via a voltage divider network connected to the one or more circuit components.

EEE 11 is the method of any one of EEE 1-10, wherein the power supply rail includes a negative power supply rail.

EEE 12 is the method of any one of EEE 1-11, wherein the power supply rail includes a positive power supply rail.

EEE 13 is the method of any one of EEE 1-12, wherein the power supply rail comprises a first power supply rail, wherein the method further comprises: adjusting a second power supply rail for the one or more circuit components to a fourth setting; adjusting the second power supply rail to a fifth setting if a predetermined quantity of the one or more voltage samples breach the first voltage threshold; and adjusting the second power supply rail to a sixth setting if the one or more voltage samples are captured during at least the threshold amount of time and do not breach the second voltage threshold, wherein a magnitude of the fourth setting is greater than a magnitude of the sixth setting.

EEE 14 is the method of EEE 13, wherein the first power supply rail includes a positive power supply rail and the second power supply rail includes a negative power supply rail.

EEE 15 is the method of EEE 13, wherein the first power supply rail includes a first positive power supply rail and the second power supply rail includes a second positive power supply rail, or the first power supply rail includes a first negative power supply rail and the second power supply rail includes a second negative power supply rail.

EEE 16 is the method of any one of EEE 13-15, wherein a processor determines whether the one or more voltage samples breach the first voltage threshold or the second voltage threshold, and wherein the processor uses one or more digital-to-analog converters to output one or more analog control signals to adjust the first power supply rail to the second setting or the third setting, and to adjust the second power supply rail to the fifth setting or the sixth setting.

EEE 17 is the method of any one of EEE 1-16 wherein a processor determines whether the one or more voltage samples breach the first voltage threshold or the second voltage threshold, wherein a logic device includes or controls a voltage converter circuit, wherein adjusting the power supply rail to the first setting includes the processor sending to the logic device a first digital control signal, wherein adjusting the power supply rail to a second setting includes the processor sending to the logic device a second digital control signal, and wherein adjusting the power supply rail to a third setting includes the processor sending to the logic device a third digital control signal.

EEE 18 is the method of EEE 17, wherein the first digital control signal, the second digital control signal, or the third digital control signal is communicated using an inter-integrated circuit protocol, a serial peripheral interface protocol, or by pulse code modulation.

EEE 19 is the method of any one of EEE 17-18, wherein the voltage converter circuit includes a linear power supply or a switch-mode power supply.

EEE 20 is the method of any one of EEE 17-19, wherein the logic device includes an application specific integrated circuit, a power supply integrated circuit, a power management integrated circuit, a processor, or a state machine with a shift register.

EEE 21 is the method of any one of EEE 1-20, wherein a processor determines whether the one or more voltage samples breach the first voltage threshold or the second voltage threshold, and wherein the processor uses a digital-to-analog converter to output an analog control signal at a first level if adjusting the power supply rail to the second setting or to a second level if adjusting the power supply rail to the third setting.

EEE 22 is the method of any one of EEE 1-21, further comprising: determining a frequency of the input signal, wherein one or more of the first setting, the second setting, or the third setting is based on whether the frequency indicates the input signal is alternating.

EEE 23 is the method of any one of EEE 1-22, wherein the first setting equals a sum of the first voltage threshold and a fixed offset voltage.

EEE 24 is the method of any one of EEE 1-23, wherein the predetermined quantity of the one or more voltage samples equals one.

EEE 25 is the method of any one of EEE 1-24, wherein the predetermined quantity of the one or more voltage samples equals a predetermined quantity of multiple consecutive voltage samples.

EEE 26 is the method of any one of EEE 1-25, wherein the predetermined quantity of the one or more voltage samples equals two or more voltage samples during the threshold amount of time.

EEE 27 is the method of any one of EEE 1-26, wherein if the predetermined quantity of the one or more voltage samples breach the first voltage threshold, then the method further comprises: adjusting the second voltage threshold to establish a modified second voltage threshold; determining one or more further voltage samples by further sampling the input voltage corresponding to the input signal; determining whether the one or more further voltage samples breach the modified second voltage threshold; and adjusting the power supply rail to a fourth setting if the one or more further voltage samples are captured during at least the threshold amount of time and do not breach the modified second voltage threshold, wherein the magnitude of the fourth setting is less than the magnitude of the second setting.

EEE 28 is the method of any one of EEE 1-27, wherein if the one or more voltage samples are captured during at least the threshold amount of time and do not breach the second voltage threshold, then the method further comprises: adjusting the first voltage threshold to establish a modified first voltage threshold; adjusting the second voltage threshold to establish a modified second voltage threshold; determining one or more further voltage samples by further sampling the input voltage corresponding to the input signal; determining whether the one or more further voltage samples breach the modified first voltage threshold or the modified second voltage threshold; adjusting the power supply rail to the second setting if a predetermined quantity of the one or more further voltage samples breach the modified first voltage threshold; and adjusting the power supply rail to a fourth setting if the one or more further voltage samples are captured during at least the threshold amount of time and do not breach the modified second voltage threshold, wherein the magnitude of the fourth setting is less than the magnitude of the second setting.

EEE 29 is the method of any one of EEE 1-28, wherein a particular voltage sample of the one or more voltage samples breaches the first voltage threshold, and wherein the second setting equals a sum of the particular voltage sample and a fixed offset voltage.

EEE 30 is the method of any one of EEE 1-29, wherein the input signal is an electrical current.

EEE 31 is the method of any one of EEE 1-29, wherein the input signal is an electrical voltage.

EEE 32 is a computing system comprising: one or more processors; and a non-transitory computer-readable memory storing executable instructions, wherein execution of the executable instructions by the one or more processors causes the computing system to: adjust a power supply rail for one or more circuit components to a first setting; determine one or more voltage samples by sampling an input voltage corresponding to an input signal; determine whether the one or more voltage samples breach a first voltage threshold or a second voltage threshold; adjust the power supply rail to a second setting if any predetermined quantity of the one or more voltage samples breach the first voltage threshold or the second voltage threshold, wherein a magnitude of the second setting equals or is greater than a magnitude of the first setting, and adjust the power supply rail to a third setting if the one or more voltage samples are captured during at least a threshold amount of time and do not breach the first voltage threshold or the second voltage threshold, wherein the magnitude of the first setting is greater than a magnitude of the third setting.

EEE 33 is the computing system of EEE 32, further comprising: one or more batteries, wherein the one or more processors, the non-transitory computer-readable memory, and the one or more circuit components are powered by the one or more batteries.

EEE 34 is a computing system comprising: one or more processors; and a non-transitory computer-readable memory storing executable instructions, wherein execution of the executable instructions by the one or more processors causes the computing system to perform the method of any one of EEE 1-31.

EEE 35 is a non-transitory computer-readable memory having stored therein instructions executable by a processor to cause a computing system to perform functions, the functions comprising: adjusting a power supply rail for one or more circuit components to a first setting; determining one or more voltage samples by sampling an input voltage corresponding to an input signal; determining whether the one or more voltage samples breach a first voltage threshold or a second voltage threshold; adjusting the power supply rail to a second setting if a predetermined quantity of the one or more voltage samples breach the first voltage threshold or the second voltage threshold, wherein a magnitude of the second setting equals or is greater than a magnitude of the first setting; and adjusting the power supply rail to a third setting if the one or more voltage samples are captured during at least a threshold amount of time and do not breach the first voltage threshold or the second voltage threshold, wherein the magnitude of the first setting is greater than a magnitude of the third setting.

EEE 36 is a non-transitory computer-readable memory having stored therein instructions executable by a processor to cause a computing system to perform the method of any one of EEE 1-31.

What is claimed is:

1. A method comprising:

adjusting a power supply rail for one or more circuit components to a first setting;

determining first and second voltage samples by sampling an input voltage corresponding to an input signal, wherein the second voltage samples are determined after the first voltage samples;

determining, by a processor, whether the first voltage samples breach a first voltage threshold or a second voltage threshold;

in response to the processor determining the first voltage samples are captured during at least a threshold amount of time and do not breach the second voltage threshold, a digital-to-analog converter outputting an analog control signal at a second level to adjust the power supply rail to a third setting, wherein a magnitude of the first setting is greater than a magnitude of the third setting; and in response to the processor subsequently determining a predetermined quantity of the second voltage samples breach the first voltage threshold, the digital-to-analog converter outputting an analog control signal at a first level to adjust the power supply rail to a second setting, wherein a magnitude of the second setting equals or is greater than a magnitude of the first setting.

2. The method of claim 1, wherein a value of the first voltage threshold is identical to a value of the second voltage threshold.

3. The method of claim 1, wherein the one or more circuit components comprise one or more analog circuit components.

4. The method of claim 3, wherein the one or more analog circuit components include a buffer amplifier and a differential amplifier.

5. The method of claim 1, wherein the one or more circuit components comprise one or more digital components.

6. A method comprising:

adjusting a power supply rail for one or more circuit components to a first setting;

determining one or more voltage samples by sampling an input voltage corresponding to an input signal;

determining whether the one or more voltage samples breach a first voltage threshold or a second voltage threshold;

adjusting the power supply rail to a second setting if a predetermined quantity of the one or more voltage samples breach the first voltage threshold, wherein a magnitude of the second setting equals or is greater than a magnitude of the first setting; and adjusting the power supply rail to a third setting if the one or more voltage samples are captured during at least a threshold amount of time and do not breach the second voltage threshold, wherein:

the magnitude of the first setting is greater than a magnitude of the third setting, the input signal is an input to a measurement device, each voltage sample of the one or more voltage samples corresponds to an amplitude of a respective portion of the input signal, and the first setting is a maximum magnitude voltage setting required for an amplitude of a maximum input signal specified to be input to the measurement device.

7. The method of claim 6, wherein adjusting the power supply rail for the one or more circuit components to the first setting occurs in response to a power-on event and/or pressing of a button.

8. The method of claim 7, wherein the button includes an on/off button or an amplifier gain button.

9. The method of claim 1, wherein the input signal is an input to a measurement device, 35                                                    36 wherein each voltage sample of the first and second voltage samples corresponds to an amplitude of a respective portion of the input signal, and wherein the first setting includes a voltage setting less than a maximum magnitude voltage setting required for an amplitude of a maximum input signal specified to be input to the measurement device.

10. The method of claim 1, further comprising:

generating the input voltage by dividing the input signal one or more times via a voltage divider network connected to the one or more circuit components.

11. The method of claim 1, wherein the power supply rail includes a negative power supply rail.

12. The method of claim 1, wherein the power supply rail includes a positive power supply rail.

13. The method of claim 1, wherein the power supply rail comprises a first power supply rail, wherein the method further comprises:

adjusting a second power supply rail for the one or more circuit components to a fourth setting;

adjusting the second power supply rail to a fifth setting if the predetermined quantity of the second voltage samples breach the first voltage threshold; and adjusting the second power supply rail to a sixth setting if the first voltage samples are captured during at least the threshold amount of time and do not breach the second voltage threshold, wherein a magnitude of the fourth setting is greater than a magnitude of the sixth setting.

14. The method of claim 13, wherein the first power supply rail includes a positive power supply rail and the second power supply rail includes a negative power supply rail.

15. The method of claim 13, wherein the first power supply rail includes a first positive power supply rail and the second power supply rail includes a second positive power supply rail, or the first power supply rail includes a first negative power supply rail and the second power supply rail includes a second negative power supply rail.

16. The method of claim 13, wherein:

the digital-to-analog converter is a first digital-to-analog converter, and the processor uses the first digital-to-analog converter or a second digital-to-analog converter to output one or more analog control signals to adjust the second power supply rail to the fifth setting or the sixth setting.

17. A method comprising:

adjusting a power supply rail for one or more circuit components to a first setting; determining one or more voltage samples by sampling an input voltage corresponding to an input signal;

determining whether the one or more voltage samples breach a first voltage threshold or a second voltage threshold;

adjusting the power supply rail to a second setting if a predetermined quantity of the one or more voltage samples breach the first voltage threshold, wherein a magnitude of the second setting equals or is greater than a magnitude of the first setting; and adjusting the power supply rail to a third setting if the one or more voltage samples are captured during at least a threshold amount of time and do not breach the second voltage threshold, wherein:

the magnitude of the first setting is greater than a magnitude of the third setting, a processor determines whether the one or more voltage samples breach the first voltage threshold or the second voltage threshold, a logic device includes or controls a voltage converter circuit, adjusting the power supply rail to the first setting includes the processor sending to the logic device a first digital control signal, adjusting the power supply rail to a second setting includes the processor sending to the logic device a second digital control signal, and adjusting the power supply rail to a third setting includes the processor sending to the logic device a third digital control signal.

18. The method of claim 17, wherein the first digital control signal, the second digital control signal, or the third digital control signal is communicated using an inter-integrated circuit protocol, a serial peripheral interface protocol, or by pulse code modulation.

19. The method of claim 17, wherein the voltage converter circuit includes a linear power supply or a switch-mode power supply.

20. The method of claim 1, further comprising:

determining a frequency of the input signal, wherein one or more of the first setting, the second setting, or the third setting is based on whether the frequency indicates the input signal is alternating.

21. The method of claim 1, wherein the first setting equals a sum of the first voltage threshold and a fixed offset voltage.

22. The method of claim 1, wherein the predetermined quantity of the second voltage samples equals one.

23. The method of claim 1, wherein the predetermined quantity of the second voltage samples equals a predetermined quantity of multiple consecutive voltage samples.

24. The method of claim 1, wherein the predetermined quantity of the second voltage samples equals two or more voltage samples during the threshold amount of time.

25. The method of claim 1, wherein if the predetermined quantity of the second voltage samples breach the first voltage threshold, then the method further comprises:

adjusting the second voltage threshold to establish a modified second voltage threshold;

determining one or more further voltage samples by further sampling the input voltage corresponding to the input signal;

determining whether the one or more further voltage samples breach the modified second voltage threshold; and adjusting the power supply rail to a fourth setting if the one or more further voltage samples are captured during at least the threshold amount of time and do not breach the modified second voltage threshold, wherein the magnitude of the fourth setting is less than the magnitude of the second setting.

26. The method of claim 1, wherein if the first voltage samples are captured during at least the threshold amount of time and do not breach the second voltage threshold, then the method further comprises:

adjusting the first voltage threshold to establish a modified first voltage threshold;

adjusting the second voltage threshold to establish a modified second voltage threshold;

determining one or more further voltage samples by further sampling the input voltage corresponding to the input signal;

determining whether the one or more further voltage samples breach the modified first voltage threshold or the modified second voltage threshold;

adjusting the power supply rail to the second setting if a predetermined quantity of the one or more further voltage samples breach the modified first voltage threshold; and adjusting the power supply rail to a fourth setting if the one or more further voltage samples are captured during at least the threshold amount of time and do not breach the modified second voltage threshold, wherein the magnitude of the fourth setting is less than the magnitude of the second setting.

27. The method of claim 1, wherein a particular voltage sample of the second voltage samples breaches the first voltage threshold, and wherein the second setting equals a sum of the particular voltage sample and a fixed offset voltage.

28. A computing system comprising:

one or more processors; and a non-transitory computer-readable memory storing executable instructions, wherein execution of the executable instructions by the one or more processors causes the computing system to:

adjust a power supply rail for one or more circuit components to a first setting;

determine first and second voltage samples by sampling an input voltage corresponding to an input signal, wherein the second voltage samples are determined after the first voltage samples;

determine, by a processor, whether the first voltage samples breach a first voltage threshold or a second voltage threshold;

output, by a digital-to-analog converter, an analog control signal at a second level to adjust the power supply rail to a third setting, in response to the one or more processors determining the first voltage samples are captured during at least a threshold amount of time and do not breach the first voltage threshold or the second voltage threshold, wherein a magnitude of the first setting is greater than a magnitude of the third setting; and output, by the digital-to-analog converter, an analog control signal at a first level to adjust the power supply rail to a second setting, in response to the one or more processors subsequently determining a pre-determined quantity of the second voltage samples breach the first voltage threshold or the second voltage threshold, wherein a magnitude of the second setting equals or is greater than a magnitude of the first setting.

29. The computing system of claim 28, further comprising:

one or more batteries, wherein the one or more processors, the non-transitory computer-readable memory, and the one or more circuit components are powered by the one or more batteries.

30. A non-transitory computer-readable memory having stored therein instructions executable by a processor to cause a computing system to perform functions, the functions comprising:

adjusting a power supply rail for one or more circuit components to a first setting;

determining first and second voltage samples by sampling an input voltage corresponding to an input signal, wherein the second voltage samples are determined after the first voltage samples;

determining, by a processor, whether the first voltage samples breach a first voltage threshold or a second voltage threshold;

in response to the processor determining the first voltage samples are captured during at least a threshold amount of time and do not breach the first voltage threshold or the second voltage threshold, a digital-to-analog converter outputting an analog control signal at a second level to adjust the power supply rail to a third setting, wherein a magnitude of the first setting is greater than a magnitude of the third setting; and in response to the processor subsequently determining a predetermined quantity of the second voltage samples breach the first voltage threshold or the second voltage threshold, the digital-to-analog converter outputting an analog control signal at a first level to adjust the power supply rail to a second setting, wherein a magnitude of the second setting equals or is greater than a magnitude of the first setting.

* * * * *